United States Patent
Matsumura

(10) Patent No.: US 11,886,112 B2
(45) Date of Patent: *Jan. 30, 2024

(54) CURABLE COMPOSITION, NEAR INFRARED ABSORBER, FILM, NEAR INFRARED CUT FILTER, SOLID-STATE IMAGING ELEMENT, IMAGE DISPLAY DEVICE, AND INFRARED SENSOR

(71) Applicant: FUJIFILM Corporation, Tokyo (JP)

(72) Inventor: Tokihiko Matsumura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 841 days.

This patent is subject to a terminal disclaimer.

(21) Appl. No.: 16/893,552

(22) Filed: Jun. 5, 2020

(65) Prior Publication Data

US 2020/0301272 A1  Sep. 24, 2020

Related U.S. Application Data

(63) Continuation of application No. PCT/JP2019/000544, filed on Jan. 10, 2019.

(30) Foreign Application Priority Data

Feb. 1, 2018 (JP) .................................. 2018-016322

(51) Int. Cl.
| | | |
|---|---|---|
| G03F 7/004 | (2006.01) | |
| G03F 7/00 | (2006.01) | |
| H01L 27/146 | (2006.01) | |
| H04N 5/33 | (2023.01) | |
| H10K 59/38 | (2023.01) | |

(52) U.S. Cl.
CPC .......... *G03F 7/0045* (2013.01); *G03F 7/0007* (2013.01); *H01L 27/14649* (2013.01); *H04N 5/33* (2013.01); *H10K 59/38* (2023.02)

(58) Field of Classification Search
CPC .... G03F 7/0045; G03F 7/0007; G03F 7/0758; G03F 7/105; G03F 7/0388; G03F 7/033; G02B 5/22; C08F 2/44; C08L 101/00; H01L 27/14649; H01L 31/0232; H04N 5/33; H10K 59/38
See application file for complete search history.

(56) References Cited

U.S. PATENT DOCUMENTS

| | | | |
|---|---|---|---|
| 9,445,017 B2* | 9/2016 | Konishi | .................. C03C 3/247 |
| 9,465,290 B2* | 10/2016 | Huang | ..................... G03F 7/11 |
| 10,901,123 B2* | 1/2021 | Arayama | ............. C08K 5/0041 |
| 2015/0146057 A1 | 5/2015 | Konishi et al. | |
| 2015/0260889 A1 | 9/2015 | Shiono et al. | |
| 2020/0301272 A1* | 9/2020 | Matsumura | ............... C08F 2/44 |
| 2021/0102010 A1* | 4/2021 | Matsumura | ....... C08F 220/1807 |
| 2022/0251391 A1* | 8/2022 | Matsumura | ......... C09B 67/0069 |

FOREIGN PATENT DOCUMENTS

| | | |
|---|---|---|
| CN | 104755969 A | 7/2015 |
| CN | 104838294 A | 8/2015 |
| JP | 2008-298820 A | 12/2008 |
| JP | 2014-52431 A | 3/2014 |
| WO | WO 2014/030628 A1 | 2/2014 |
| WO | WO 2014/088063 A1 | 6/2014 |
| WO | WO 2016/043166 A1 | 3/2016 |
| WO | WO 2016/114363 A1 | 7/2016 |
| WO | WO 2017/170339 A1 | 10/2017 |

OTHER PUBLICATIONS

Taiwanese Office Action for corresponding Taiwanese Application No. 108101900, dated Nov. 30, 2022, with English translation.
Japanese Notice of Reasons for Refusal for Japanese Application No. 2019-568960, dated Aug. 17, 2021, with an English translation.
International Preliminary Report on Patentability, dated Aug. 13, 2020, and English translation of the Written Opinion of the International Searching Authority, dated Apr. 9, 2019, (Forms PCT/IB/326, PCT/IB/338, PCT/IB/373, and PCT/ISA/237) for International Application No. PCT/JP2019/000544.
International Search Report for International Application No. PCT/JP2019/000544, dated Apr. 9, 2019.
Taiwanese Office Action for corresponding Taiwanese Application No. 108101900, dated Aug. 19, 2022, including an English translation.

* cited by examiner

*Primary Examiner* — Geraldina Visconti
(74) *Attorney, Agent, or Firm* — Birch, Stewart, Kolasch & Birch, LLP

(57) ABSTRACT

A curable composition includes: a near infrared absorbing colorant having a group represented by the following Formula (1); and a curable compound. In the formula, $G^1$ represents $NR^{G1}$ or an oxygen atom, and $R^{G1}$ represents a hydrogen atom or a monovalent substituent. $G^2$ represents a monovalent substituent having a -Es' value of 2.4 or higher as a steric parameter.

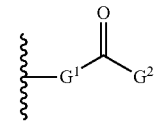

(1)

14 Claims, 1 Drawing Sheet

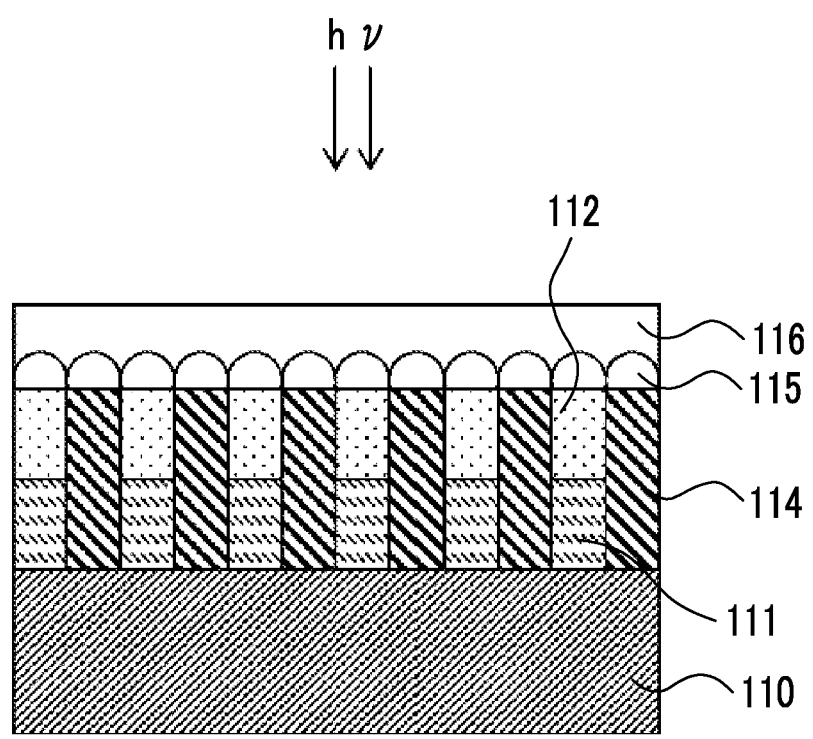

CURABLE COMPOSITION, NEAR INFRARED ABSORBER, FILM, NEAR INFRARED CUT FILTER, SOLID-STATE IMAGING ELEMENT, IMAGE DISPLAY DEVICE, AND INFRARED SENSOR

CROSS-REFERENCE TO RELATED APPLICATIONS

This application is a Continuation of PCT International Application No. PCT/JP2019/000544 filed on Jan. 10, 2019, which claims priority under 35 U.S.C § 119(a) to Japanese Patent Application No. 2018-016322 filed on Feb. 1, 2018. Each of the above application(s) is hereby expressly incorporated by reference, in its entirety, into the present application.

BACKGROUND OF THE INVENTION

1. Field of the Invention

The present invention relates to a curable composition including a near infrared absorbing colorant. In addition, the present invention relates to a near infrared absorber, a film, a near infrared cut filter, a solid-state imaging element, an image display device, and an infrared sensor.

2. Description of the Related Art

In a video camera, a digital still camera, a mobile phone with a camera function, or the like, a charge coupled device (CCD) or a complementary metal-oxide semiconductor (CMOS), which is a solid-state imaging element for a color image, is used. In a light receiving section of this solid-state imaging element, a silicon photodiode having sensitivity to infrared light is used. Therefore, it is necessary to correct visibility, and a near infrared cut filter is used in many cases.

As a near infrared absorbing colorant used for a near infrared cut filter, for example, a squarylium compound is known. For example, WO2014/088063A describes that a near infrared cut filter or the like is manufactured using a curable composition including a specific squarylium compound.

SUMMARY OF THE INVENTION

According to an investigation by the present inventors, it was found that the film that is obtained using the curable composition including the squarylium compound described in WO2014/088063A has insufficient light fastness and moisture resistance and has room for further improvement.

Accordingly, an object of the present invention is to provide a curable composition with which a film having excellent light fastness and moisture resistance can be formed. In addition, another object of the present invention is to provide a near infrared absorber, a film, a near infrared cut filter, a solid-state imaging element, an image display device, and an infrared sensor.

As a result of various investigations, the present inventors found that the objects can be achieved by using a composition including a near infrared absorbing colorant having a predetermined group described below, thereby completing the present invention. The present invention provides the following.

<1> A curable composition comprising:
a near infrared absorbing colorant having a group represented by the following Formula (1); and
a curable compound,

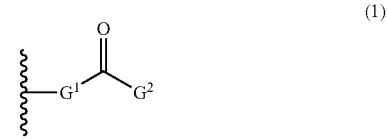

in the formula, $G^1$ represents $NR^{G1}$ or an oxygen atom,
$R^{G1}$ represents a hydrogen atom or a monovalent substituent, and
$G^2$ represents a monovalent substituent having a -Es' value of 2.4 or higher as a steric parameter.

<2> The curable composition according to <1>,
in which $G^2$ represents a tertiary alkyl group.

<3> A curable composition comprising:
a near infrared absorbing colorant having a group represented by the following Formula (10); and
a curable compound,

in the formula, $G^{11}$ represents $NR^{G11}$ or an oxygen atom,
$R^{G11}$ represents a hydrogen atom or a monovalent substituent, and
$G^{12}$ represents a tertiary alkyl group having 6 or more carbon atoms.

<4> The curable composition according to any one of <1> to <3>,
in which the near infrared absorbing colorant has a maximum absorption wavelength in a range of 650 to 1200 nm.

<5> The curable composition according to any one of <1> to <4>,
in which the near infrared absorbing colorant is a polymethine compound.

<6> The curable composition according to any one of <1> to <5>,
in which the near infrared absorbing colorant is at least one selected from a cyanine compound, a squarylium compound, or a croconium compound.

<7> The curable composition according to <1>,
in which the near infrared absorbing colorant is a compound represented by the following Formula (SQ1),

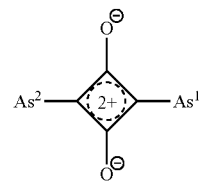

in the formula, $As^1$ and $As^2$ each independently represent an aryl group, a heterocyclic group, or a group represented by Formula (As-1), and at least one of $As^1$ or $As^2$ has the group represented by Formula (1) as a substituent,

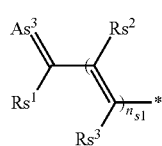
(As-1)

in the formula, * represents a bonding site, $Rs^1$ $Rs^3$ each independently represent a hydrogen atom or an alkyl group, $As^3$ represents a heterocyclic group, $n_{s1}$ represents an integer of 0 or more, $Rs^1$ and $Rs^2$ may be bonded to each other to form a ring, $Rs^1$ and $As^3$ may be bonded to each other to form a ring, $Rs^2$ and $Rs^3$ may be bonded to each other to form a ring, and in a case where $n_{s1}$ represents 2 or more, a plurality of $Rs^2$'s may be the same as or different from each other and a plurality of $Rs^3$'s may be the same as or different from each other.

<8> The curable composition according to <1>, in which the near infrared absorbing colorant is a compound represented by the following Formula (Cy1),

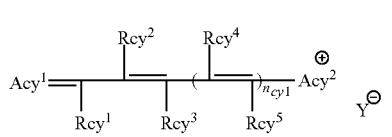
(Cy1)

in the formula, Y represents an anion, $Rcy^1$ to $Rcy^5$ each independently represent a hydrogen atom or a substituent, at least one of $Rcy^1$, $Rcy^2$, $Rcy^3$, $Rcy^4$ or $Rcy^5$ represents the group represented by Formula (1), two of $Rcy^1$ to $Rcy^5$ may be bonded to each other to form a ring, $n_{cy1}$ represents an integer of 0 to 2, in a case where $n_{cy1}$ represents 2, a plurality of $Rcy^4$'s may be the same as or different from each other and a plurality of $Rcy^5$'s may be the same as or different from each other, and $Acy^1$ and $Acy^2$ each independently represent an aryl group or a heterocyclic group.

<9> The curable composition according to <1>, in which the near infrared absorbing colorant is a compound represented by the following Formula (Cr1),

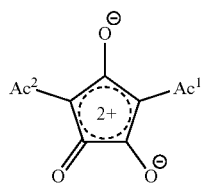
(Cr1)

in the formula, $Ac^1$ and $Ac^2$ each independently represent an aryl group, a heterocyclic group, or a group represented by Formula (Ac-1), and at least one of $Ac^1$ or $Ac^2$ has the group represented by Formula (1) as a substituent,

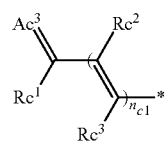
(Ac-1)

in the formula, * represents a bonding site, $Rc^1$ to $Rc^3$ each independently represent a hydrogen atom or an alkyl group, $Ac^3$ represents a heterocyclic group, $n_{c1}$ represents an integer of 0 or more, $Rc^1$ and $Rc^2$ may be bonded to each other to form a ring, $Rc^1$ and $Ac^3$ may be bonded to each other to form a ring, $Rc^2$ and $Rc^3$ may be bonded to each other to form a ring, and in a case where $n_{c1}$ represents 2 or more, a plurality of $Rc^2$'s may be the same as or different from each other and a plurality of $Rc^3$'s may be the same as or different from each other.

<10> A near infrared absorber comprising a near infrared absorbing colorant having a group represented by the following Formula (1),

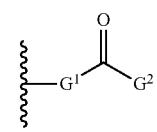
(1)

in the formula, $G^1$ represents $NR^{G1}$ or an oxygen atom, $R^{G1}$ represents a hydrogen atom or a monovalent substituent, and $G^2$ represents a monovalent substituent having a -Es' value of 2.4 or higher as a steric parameter.

<11> A near infrared absorber comprising a near infrared absorbing colorant having a group represented by the following Formula (10),

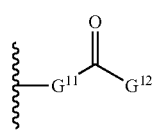
(10)

in the formula, $G^{11}$ represents $NR^{G11}$ or an oxygen atom, $R^{G11}$ represents a hydrogen atom or a monovalent substituent, and $G^{12}$ represents a tertiary alkyl group having 6 or more carbon atoms.

<12> A film which is formed of the curable composition according to any one of <1> to <9>.

<13> A near infrared cut filter comprising:

the film according to <12>.

<14> A solid-state imaging element comprising:
the film according to <12>.
<15> An image display device comprising:
the film according to <12>.
<16> An infrared sensor comprising:
the film according to <12>.

According to the present invention, a curable composition with which a film having excellent light fastness and moisture resistance can be formed can be provided. In addition, a near infrared absorber, a film, a near infrared cut filter, a solid-state imaging element, an image display device, and an infrared sensor can be provided.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, a weight-average molecular weight and a number-average molecular weight are defined as values in terms of polystyrene obtained by gel permeation chromatography (GPC). In this specification, the weight-average molecular weight (Mw) and the number-average molecular weight (Mn) can be obtained, for example, by using HLC-8220GPC (manufactured by Tosoh Corporation), using a column in which TOSOH TSK gel Super HZM-H, TOSOH TSK gel Super HZ4000, and TOSOH TSK gel Super HZ2000 are linked to each other as a column, and using tetrahydrofuran as a developing solvent.

In this specification, in a chemical formula, Me represents a methyl group, Et represents an ethyl group, Bu represents a butyl group, and Ph represents a phenyl group.

In this specification, near infrared light denotes light (electromagnetic wave) having a wavelength in a range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Curable Composition>

A curable composition according to an embodiment of the present invention comprises: a near infrared absorbing colorant having a group represented by Formula (1) described below or a near infrared absorbing colorant having a group represented by Formula (10) described below; and a curable compound. Hereinafter, the near infrared absorbing colorant having a group represented by Formula (1) will also be referred to as "near infrared absorbing colorant (1)". In addition, the near infrared absorbing colorant having a group represented by Formula (10) will also be referred to as "near infrared absorbing colorant (10)".

By using the curable composition according to the embodiment of the present invention, a film having excellent light fastness and moisture resistance can be formed. The mechanism for the effect is presumed to be as follows.

The near infrared absorbing colorant (1) has a group represented by Formula (1). This group has an amide bond (in a case where $G^1$ represents $NR^{G1}$) or an ester bond (in a case where $G^1$ represents an oxygen atom). Therefore, donating properties are improved, a maximum absorption wavelength is shifted to a longer wavelength side, and an absorption is present on a longer wavelength side. Thus, the near infrared absorbing colorant (1) has spectral characteristics in which near infrared blocking properties and visible transparency are excellent. In Formula (1), $G^2$ represents a monovalent substituent having a -Es' value of 2.4 or higher as a steric parameter. Therefore, the group represented by Formula (1) has a steric hindrance in the vicinity of the amide bond or the ester bond. Thus, it is presumed, even in a case where the near infrared absorbing colorant (1) is irradiated with light, a motion in a photoexcited state of the near infrared absorbing colorant (1) can be suppressed, and photodissociation of the near infrared absorbing colorant (1) can be suppressed. As a result, it is presumed that excellent light fastness can be obtained. In addition, it is presumed that, since the group represented by Formula (1) has a steric hindrance in the vicinity of the amide bond or the ester bond, the group represented by Formula (1) is not likely to be hydrolyzed, and excellent moisture resistance can be obtained. In addition, in a case where particles of the near infrared absorbing colorant excessively aggregate during film formation, the visible transparency of the obtained film is likely to deteriorate. The near infrared absorbing colorant (1) has a group represented by Formula (1) as a group having a high steric hindrance. Therefore, aggregation of the near infrared absorbing colorant (1) during film formation can be suppressed, and thus a film having higher visible transparency can also be formed.

In addition, it is presumed that, with the near infrared absorbing colorant (10), a film having excellent light fastness and moisture resistance can be formed using the same mechanism as that of the near infrared absorbing colorant (1). In Formula (10), $G^{12}$ represents a tertiary alkyl group having 6 or more carbon atoms. Therefore, the steric hindrance in the vicinity of the amide bond or the ester bond is high. Thus, it is presumed, even in a case where the near infrared absorbing colorant (10) is irradiated with light, a motion in a photoexcited state of the near infrared absorbing colorant (10) can be suppressed, and photodissociation of the near infrared absorbing colorant (10) can be suppressed. As a result, it is presumed that excellent light fastness can be obtained. In addition, it is presumed that, since the group represented by Formula (10) has a steric hindrance in the vicinity of the amide bond or the ester bond, the group represented by Formula (10) is not likely to be hydrolyzed, and excellent moisture resistance can be obtained. In addition, in a case where particles of the near infrared absorbing colorant excessively aggregate during film formation, the visible transparency of the obtained film is likely to deteriorate. The near infrared absorbing colorant (10) has a group represented by Formula (10) as a group having a high steric hindrance. Therefore, aggregation of the near infrared absorbing colorant (10) during film formation can be suppressed, and thus a film having higher visible transparency can also be formed.

Hereinafter, each of the components of the curable composition according to the embodiment of the present invention will be described.

<<Near Infrared Absorbing Colorant A>>

The curable composition includes the near infrared absorbing colorant (the near infrared absorbing colorant (1)) having the group represented by Formula (1) or the near infrared absorbing colorant (the near infrared absorbing colorant (10)) having the group represented by Formula (10). Hereinafter, the near infrared absorbing colorant (1) and the near infrared absorbing colorant (10) will be collectively referred to as "near infrared absorbing colorant A".

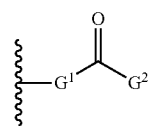

(1)

In Formula (1), $G^1$ represents $NR^{G1}$ or an oxygen atom, $R^{G1}$ represents a hydrogen atom or a monovalent substituent, and $G^2$ represents a monovalent substituent having a -Es' value of 2.4 or higher as a steric parameter.

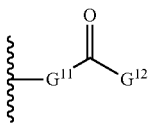

(10)

In the formula, $G^{11}$ represents $NR^{G11}$ or an oxygen atom, $R^{G11}$ represents a hydrogen atom or a monovalent substituent, and $G^{12}$ represents a tertiary alkyl group having 6 or more carbon atoms.

In Formula (1), $G^1$ represents $NR^{G1}$ or an oxygen atom, and $R^{G1}$ represents a hydrogen atom or a monovalent substituent. It is preferable that the monovalent substituent represented by $R^{G1}$ is a hydrocarbon group. Examples of the hydrocarbon group include an alkyl group and an aryl group. Among these, an alkyl group is preferable. The number of carbon atoms in the alkyl group is preferably 1 to 30, more preferably 1 to 20, and still more preferably 1 to 10. The number of carbon atoms in the aryl group is preferably 6 to 30, more preferably 6 to 20, and still more preferably 6 to 10. In Formula (1), $G^1$ represents preferably $NR^{G1}$. In addition, $R^{G1}$ represents preferably a hydrogen atom or an alkyl group and more preferably a hydrogen atom.

In Formula (1), $G^2$ represents a monovalent substituent having a -Es' value of 2.4 or higher as a steric parameter. The -Es' value of the monovalent substituent represented $G^2$ is preferably 3.3 or higher, more preferably 4.0 or higher, still more preferably 4.5 or higher, and still more preferably 5.0 or higher. In this specification, the -Es' value is a parameter representing the steric bulk of a substituent. It can be said that, as the -Es' value of a substituent increases, the substituent is a bulky substituent. Specific examples of the -Es' value of the substituent are shown in the document (J. A. Macphee, et al., Tetrahedron, Vol. 34, pp. 3553 to 3562, edited by Toshio Fujita, Special Edition for Chemistry 107 Structure-Activity Relationship and Drag Design, published on Feb. 20, 1986 (Kagaku Dojin)).

The monovalent substituent represented by $G^2$ is not particularly limited as long as it is a group having a -Es' value of 2.4 or higher. Examples of the monovalent substituent represented by $G^2$ include a hydrocarbon group. In particular, an alkyl group or an aryl group is preferable, and an alkyl group is more preferable. In the alkyl group or the aryl group, some hydrogen atoms may be substituted with, for example, a halogen atom, a hydroxy group, or an alkoxy group. The alkyl group is preferably a secondary alkyl group or a tertiary alkyl group and more preferably a tertiary alkyl group from the viewpoint that higher light fastness can be easily obtained. The detailed reason is not clear but is presumed that, since the tertiary alkyl group has high donating properties, a motion in a photoexcited state of the near infrared absorbing colorant can be more effectively suppressed. In addition, since the tertiary alkyl group has high donating properties, the maximum absorption wavelength of the near infrared absorbing colorant can also be shifted to a longer wavelength side, and higher near infrared blocking properties can be easily obtained.

The number of carbon atoms in the alkyl group is preferably 6 or more and more preferably 7 or more. The upper limit is preferably 25 or less and more preferably 20 or less. The monovalent substituent represented by $G^2$ is preferably a secondary alkyl group or a tertiary alkyl group having 6 or more carbon atoms and more preferably a tertiary alkyl group having 6 or more carbon atoms.

Hereinafter, specific examples of the group having a -Es' value of 2.4 or higher will be shown, but the present invention is not limited thereto.

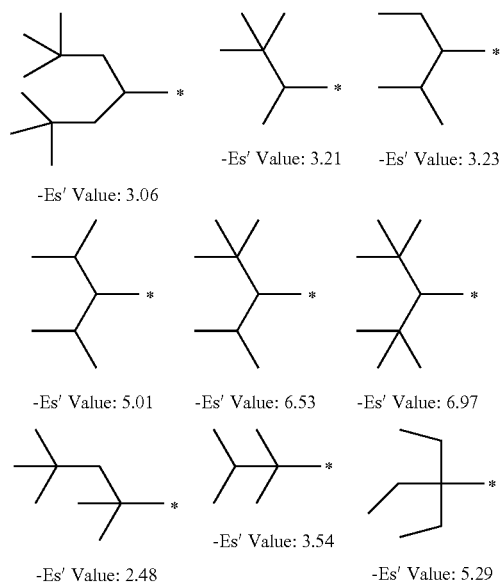

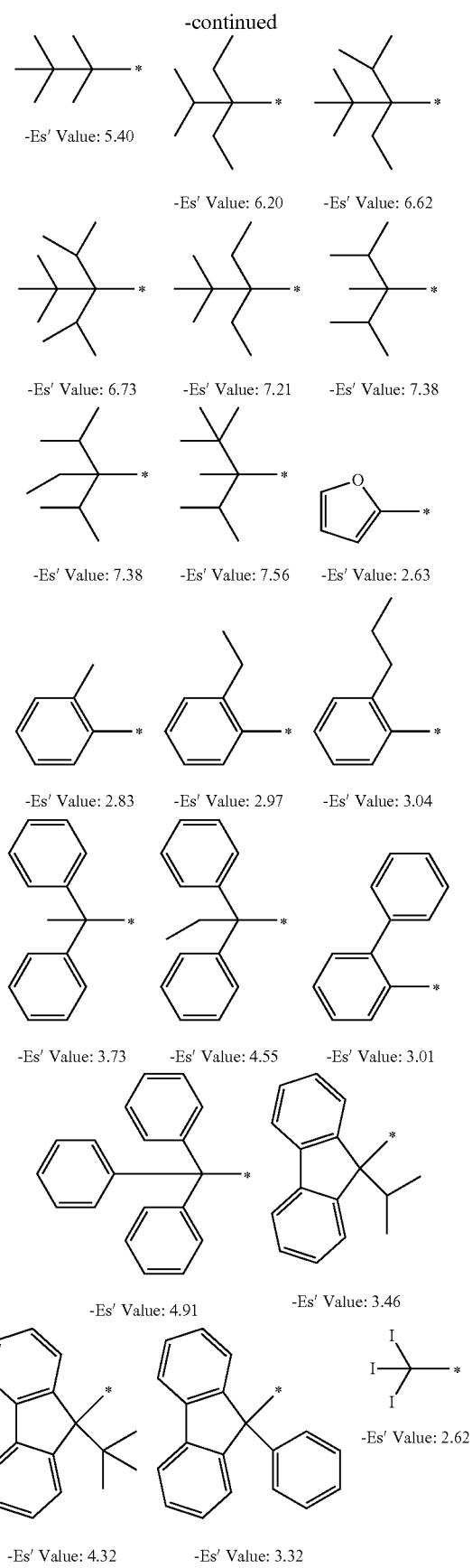

In Formula (10), $G^{11}$ represents $NR^{G11}$ or an oxygen atom, and $R^{G11}$ represents a hydrogen atom or a monovalent substituent. It is preferable that the monovalent substituent represented by $R^{G11}$ is a hydrocarbon group. Examples of the hydrocarbon group include an alkyl group and an aryl group. Among these, an alkyl group is preferable. The number of carbon atoms in the alkyl group is preferably 1 to 30, more preferably 1 to 20, and still more preferably 1 to 10. The number of carbon atoms in the aryl group is preferably 6 to 30, more preferably 6 to 20, and still more preferably 6 to 10. In Formula (10), $G^{11}$ represents preferably $NR^{G11}$. In addition, $R^{G11}$ represents preferably a hydrogen atom or an alkyl group and more preferably a hydrogen atom.

In Formula (10), $G^{12}$ represents a tertiary alkyl group having 6 or more carbon atoms. The number of carbon atoms in the tertiary alkyl group is more preferably 7 or more. The upper limit is preferably 25 or less and more preferably 20 or less. The -Es' value of $G^{12}$ is preferably 2.4 or higher, more preferably 3.3 or higher, still more preferably 4.0 or higher, still more preferably 4.5 or higher, and still more preferably 5.0 or higher.

Specific preferable examples of $G^{12}$ include tertiary alkyl groups among the specific examples of $G^2$.

The near infrared absorbing colorant A has a maximum absorption wavelength preferably in a range of 650 to 1200 nm, more preferably in a wavelength range of 700 to 1200 nm, and still more preferably in a wavelength range of 700 to 1000 nm. By allowing the near infrared absorbing colorant A to have the maximum absorption wavelength in the above-described range, a film having excellent near infrared blocking properties and visible transparency can be easily formed. The near infrared absorbing colorant A may be a pigment or a dye. From the viewpoints that the effects of the present invention can be more significantly obtained and a film having higher visible transparency can be easily formed, it is preferable that the near infrared absorbing colorant A is a dye.

The near infrared absorbing colorant A is not particularly limited as long as it is a compound having the group represented by Formula (1) or the group represented by Formula (10). Examples of the near infrared absorbing colorant A include a polymethine compound, a pyrrolopyrrole compound, a phthalocyanine compound, a naphthalocyanine compound, a quaterrylene compound, a merocyanine compound, a diimmonium compound, a dithiol compound, a triarylmethane compound, a pyrromethene compound, an azomethine compound, an anthraquinone compound, and a dibenzofuranone compound. From the viewpoint that the effects of the present invention can be more significantly obtained, a polymethine compound is preferable, a cyanine compound, a squarylium compound, a croconium compound, or an oxonol compound is more preferable, and a cyanine compound, a squarylium compound, or a croconium compound is still more preferable.

In the near infrared absorbing colorant A, the number of groups represented by Formula (1) or groups represented by Formula (10) in one molecule is 1 or more, preferably 2 or more, more preferably 2 to 10, still more preferably 2 to 6, and still more preferably 2 to 4. In addition, in a case where the near infrared absorbing colorant A is a cyanine compound, the number of groups represented by Formula (1) or groups represented by Formula (10) in one molecule is preferably 1 to 10, more preferably 1 to 6, and still more preferably 1 to 4. In a case where the near infrared absorbing colorant A is a squarylium compound, the number of groups represented by Formula (1) or groups represented by Formula (10) in one molecule is preferably 1 to 10, more preferably 2 to 10, and still more preferably 2 to 4. In a case where the near infrared absorbing colorant A is a croconium compound, the number of groups represented by Formula (1) or groups represented by Formula (10) in one molecule is preferably 1 to 10, more preferably 2 to 10, and still more preferably 2 to 4.

(Squarylium Compound)

It is preferable that the squarylium compound as the near infrared absorbing colorant A is a compound represented by the following Formula (SQ1).

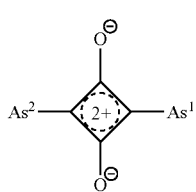

(SQ1)

In the formula, $As^1$ and $As^2$ each independently represent an aryl group, a heterocyclic group, or a group represented by Formula (As-1). At least one of $As^1$ or $As^2$ represents the group represented by Formula (1) or the group represented by Formula (10) as a substituent.

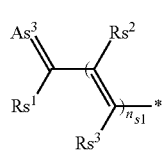

(As-1)

In the formula, * represents a bonding site.

$Rs^1$ to $Rs^3$ each independently represent a hydrogen atom or an alkyl group.

$As^3$ represents a heterocyclic group.

$n_{s1}$ represents an integer of 0 or more.

$Rs^1$ and $Rs^2$ may be bonded to each other to form a ring.

$Rs^1$ and $As^3$ may be bonded to each other to form a ring.

$Rs^2$ and $Rs^3$ may be bonded to each other to form a ring.

In a case where $n_{s1}$ represents 2 or more, a plurality of $Rs^2$'s may be the same as or different from each other and a plurality of $Rs^3$'s may be the same as or different from each other.

The number of carbon atoms in the aryl group represented by $As^1$ and $As^2$ is preferably 6 to 48, more preferably 6 to 22, and still more preferably 6 to 12.

It is preferable that the heterocyclic group represented by $As^1$, $As^2$, and $As^3$ is a 5- or 6-membered heterocyclic group. In addition, the heterocyclic group is preferably a monocyclic or fused heterocyclic group composed of 2 to 8 rings, more preferably a monocycle or a monocyclic or fused heterocyclic group composed of 2 to 4 rings, still more preferably a monocyclic or fused heterocyclic group composed of 2 or 3 rings, and still more preferably a monocyclic or fused heterocyclic group composed of 2 rings. Examples of a heteroatom included in the ring of the heterocyclic group include a nitrogen atom, an oxygen atom, and a sulfur atom. Among these, a nitrogen atom or a sulfur atom is preferable. The number of heteroatoms constituting the ring of the heterocyclic group is preferably 1 to 3 and more preferably 1 or 2.

$Rs^1$ to $Rs^3$ in Formula (As-1) each independently represent a hydrogen atom or an alkyl group. The number of carbon atoms in the alkyl group represented by $Rs^1$ to $Rs^3$ is preferably 1 to 20, more preferably 1 to 15, and still more preferably 1 to 8. The alkyl group may be linear, branched, or cyclic and is preferably linear or branched. It is preferable that $Rs^1$ to $Rs^3$ represent a hydrogen atom.

$n_{s1}$ in Formula (As-1) represents an integer of 0 or more. $n_{s1}$ represents preferably an integer of 0 to 2, more preferably 0 or 1, and still more preferably 0.

In Formula (As-1), $Rs^1$ and $Rs^2$ may be bonded to each other to form a ring, $Rs^1$ and $As^3$ may be bonded to each other to form a ring, and $Rs^2$ and $Rs^3$ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include a substituent T described below.

In Formula (SQ1), it is preferable that the group represented by $As^1$ and $As^2$ has a substituent. Examples of the substituent include the substituent T described below, the above-described group represented by Formula (1), and the above-described group represented by Formula (10). In the compound represented by Formula (SQ1), it is preferable that at least one of $As^1$ or $As^2$ represents the group represented by Formula (1) or the group represented by Formula (10) as a substituent.

In Formula (SQ1), it is preferable that $As^1$ and $As^2$ each independently represent an aryl group or a heterocyclic group, or it is preferable that $As^1$ and $As^2$ each independently represent a group represented by Formula (As-1).

(Substituent T)

Examples of the substituent T include a halogen atom, a cyano group, a nitro group, an alkyl group, an alkenyl group, an alkynyl group, an aryl group, a heteroaryl group, —$ORt^1$, —$CORt^1$, —$COORt^1$, —$OCORt^1$, —$NRt^1Rt^2$, —$NHCORt^1$, —$CONRt^1Rt^2$, —$NHCONRt^1Rt^2$, —$NHCOORt^1$, —$SRt^1$, —$SO_2Rt^1$, —$SO_2ORt^1$, —$NHSO_2Rt^1$, and —$SO_2NRt^1Rt^2$. $Rt^1$ to $Rt^2$ each independently represent a hydrogen atom, an alkyl group, an alkenyl group, an alkynyl group, an aryl group, or a heteroaryl group. $Rt^1$ and $Rt^2$ may be bonded to each other to form a ring. In a case where $Rt^1$ in —$COORt^1$ represents a hydrogen atom, the hydrogen atom may be dissociable or may be in the form of a salt. In a case where $Rt^1$ in —$SO_2ORt^1$ represents a hydrogen atom, the hydrogen atom may be dissociable or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

The heteroaryl group is preferably a monocyclic or fused heteroaryl group having composed of 2 to 8 rings, and more preferably a monocyclic or fused heteroaryl group having composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12.

The alkyl group, the alkenyl group, the alkynyl group, the aryl group, and the heteroaryl group may have a substituent or may be unsubstituted. Examples of the substituent include the substituents described above regarding the substituent T.

As shown below, cations in Formula (SQ1) are present without being localized.

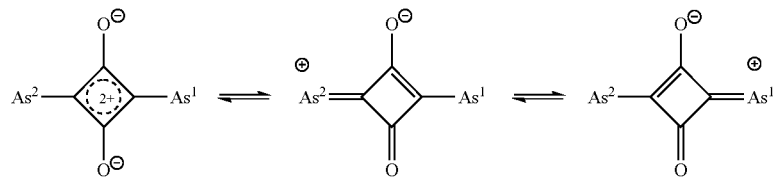

It is preferable that the compound represented by Formula (SQ1) is a compound represented by the following Formula (SQ2) or a compound represented by the following Formula (SQ3).

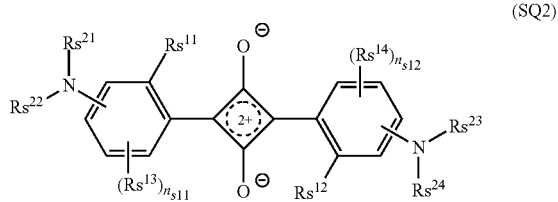

(SQ2)

$Rs^{11}$ and $Rs^{12}$ each independently represent a hydrogen atom or a substituent, and at least one of $Rs^{11}$ or $Rs^{12}$ represents a group represented by Formula (1) or a group represented by Formula (10).

$Rs^{13}$ and $Rs^{14}$ each independently represent a substituent.

$n_{s11}$ and $n_{s12}$ each independently represent an integer of 0 to 3.

In a case where $n_{s11}$ represents 2 or more, two $Rs^{13}$'s may be bonded to each other to form a ring.

In a case where $n_{s12}$ represents 2 or more, two $Rs^{14}$'s may be bonded to each other to form a ring.

$Rs^{21}$ to $Rs^{24}$ each independently represent an alkyl group, an aryl group, or a heteroaryl group.

$Rs^{21}$ and $Rs^{22}$, $Rs^{23}$ and $Rs^{24}$, $Rs^{21}$ and $Rs^{13}$, $Rs^{22}$ and $Rs^{13}$, $Rs^{23}$ and $Rs^{14}$, $Rs^{24}$ and $Rs^{14}$, $Rs^{21}$ and a ring two $Rs^{13}$'s formed by being bonded to each other, or $Rs^{23}$ and a ring formed by two $Rs^{14}$'s being bonded to each other may be bonded to each other to form a ring.

Examples of the substituent represented by $Rs^{11}$ and $Rs^{12}$ in Formula (SQ2) include the above-described substituent T, the above-described group represented by Formula (1), and the above-described group represented by Formula (10). In the compound represented by Formula (SQ2), it is prefer-able that at least one of $Rs^{11}$ or $Rs^{12}$ represents a group represented by Formula (1) or a group represented by Formula (10) and $Rs^{11}$ or $Rs^{12}$ represents a group represented by Formula (1) or a group represented by Formula (10).

Examples of the substituent represented by $Rs^{13}$ and $Rs^{14}$ in Formula (SQ2) include the above-described substituent T.

In Formula (SQ2), $Rs^{21}$ to $Rs^{24}$ each independently represent an alkyl group, an aryl group, or a heteroaryl group. The number of carbon atoms in the alkyl group is preferably 1 to 20, more preferably 1 to 15, and still more preferably 1 to 8. The alkyl group may be linear, branched, or cyclic and is preferably linear or branched. The number of carbon atoms in the aryl group is preferably 6 to 30, more preferably 6 to 20, and still more preferably 6 to 12. The heteroaryl group is preferably a monocyclic or fused heteroaryl group having composed of 2 to 8 rings, and more preferably a monocyclic or fused heteroaryl group having composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. The number of carbon atoms constituting the ring of the heteroaryl group is preferably 3 to 30, more preferably 3 to 18, and still more preferably 3 to 12. The alkyl group, the aryl group, and the heteroaryl group may have a substituent or may be unsubstituted. Examples of the substituent include the substituents described above regarding the substituent T.

In Formula (SQ2), $n_{s11}$ and $n_{s12}$ each independently represent an integer of 0 to 3 and preferably an integer of 0 to 2.

In Formula (SQ2), in a case where $n_{s11}$ represents 2 or more, two $Rs^{13}$'s may be bonded each other to form a ring. In a case where $n_{s12}$ represents 2 or more, two $Rs^{14}$'s may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

In Formula (SQ2), $Rs^{21}$ and $Rs^{22}$, $Rs^{23}$ and $Rs^{24}$, $Rs^{21}$ and $Rs^{13}$, $Rs^{22}$ and $Rs^{13}$, $Rs^{23}$ and $Rs^{14}$, or $Rs^{24}$ and $Rs^{14}$ may be bonded to each other to form a ring. In addition, in a case where two $Rs^{13}$'s are bonded to each other to form a ring, $Rs^{21}$ and a ring formed by two $Rs^{13}$'s being bonded to each other may be further bonded to each other to form a ring. In addition, in a case where two $Rs^{14}$'s are bonded to each other to form a ring, $Rs^{23}$ and a ring formed by two $Rs^{14}$'s being bonded to each other may be further bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T. In a case where $Rs^{21}$ and a ring formed by two $Rs^{13}$'s being bonded to each other are further bonded to each other to form a ring, the ring has, for example, the following structure. In the following formula, A1 represents a ring formed by two $Rs^{13}$'s being bonded to each other, A2 represents a ring formed by the ring A1 and $Rs^{22}$ being bonded to each other, $Rs^{22}$ represents an alkyl group, an aryl group, or a heteroaryl group, $Rs^{11}$ and $Rs^{13a}$ represent a hydrogen atom or a substituent, and * represents a bonding site. The same can be applied to a case where $Rs^{23}$ and a ring formed by two $Rs^{14}$'s being bonded to each other are further bonded to each other to form a ring.

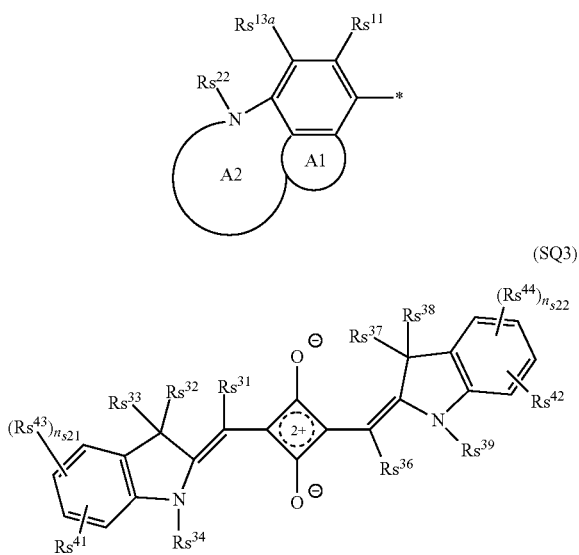

(SQ3)

$Rs^{31}$ to $RS^{34}$ and $Rs^{36}$ to $Rs^{39}$ each independently represent a hydrogen atom or an alkyl group.

$Rs^{31}$ and $Rs^{32}$, $Rs^{31}$ and $Rs^{34}$, $Rs^{32}$ and $Rs^{33}$, $Rs^{36}$ and $Rs^{37}$, $Rs^{36}$ and $Rs^{39}$, or $Rs^{37}$ and $Rs^{38}$ may be bonded to each other to form a ring.

$Rs^{41}$ and $Rs^{42}$ each independently represent a hydrogen atom or a substituent, and at least one of $Rs^{41}$ or $Rs^{42}$ represents a group represented by Formula (1) or a group represented by Formula (10).

$Rs^{43}$ and $Rs^{44}$ each independently represent a substituent.

$n_{s21}$ and $n_{s22}$ each independently represent an integer of 0 to 3.

In a case where $n_{s21}$ represents 2 or more, two $Rs^{43}$'s may be bonded to each other to form a ring.

In a case where $n_{s22}$ represents 2 or more, two $Rs^{44}$'s may be bonded to each other to form a ring.

The number of carbon atoms in the alkyl group represented by $Rs^{31}$ to $Rs^{34}$ and $Rs^{36}$ to $Rs^{39}$ in Formula (SQ3) is preferably 1 to 20, more preferably 1 to 15, and still more preferably 1 to 8. The alkyl group may be linear, branched, or cyclic and is preferably linear or branched. The alkyl group may have a substituent or may be unsubstituted. Examples of the substituent include the substituents described above regarding the substituent T.

In Formula (SQ3), $Rs^{31}$ and $Rs^{32}$, $Rs^{31}$ and $Rs^{34}$, $Rs^{32}$ and $Rs^{33}$, $Rs^{36}$ and $Rs^{37}$, $Rs^{36}$ and $Rs^{39}$, or $Rs^{37}$ and $Rs^{38}$ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

Examples of the substituent represented by $Rs^{41}$ and $Rs^{42}$ in Formula (SQ3) include the above-described substituent T, the above-described group represented by Formula (1), and the above-described group represented by Formula (10). In the compound represented by Formula (SQ3), it is preferable that at least one of $Rs^{41}$ or $Rs^{42}$ represents a group represented by Formula (1) or a group represented by Formula (10) and $Rs^{41}$ or $Rs^{42}$ represents a group represented by Formula (1) or a group represented by Formula (10).

Examples of the substituent represented by $Rs^{43}$ and $Rs^{44}$ in Formula (SQ3) include the above-described substituent T.

In Formula (SQ3), $n_{s21}$ and $n_{s22}$ each independently represent an integer of 0 to 3 and preferably an integer of 0 to 2.

In Formula (SQ3), in a case where $n_{s21}$ represents 2 or more, two $Rs^{43}$'s may be bonded each other to form a ring. In a case where $n_{s22}$ represents 2 or more, two $Rs^{44}$'s may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

The squarylium compound can be manufactured using a well-known method of the related art, for example, a method described in WO2014/088063A. Specifically, the squarylium compound can be manufactured by causing 3,4-dihydroxy-3-cyclobutene-1,2-dione (hereinafter, also referred to as "squaric acid") to react with a compound having a fused ring capable of forming a structure represented by Formula (SQ1) by being bonded to squaric acid. For example, in a case where the squarylium compound has a bilaterally symmetric structure, two equivalents of the compound having a fused ring that has the desired structure in the above-described range may be provided with respect to one equivalent of squaric acid for the reaction.

(Cyanine Compound)

It is preferable that the cyanine compound as the near infrared absorbing colorant A is a compound represented by the following Formula (Cy1).

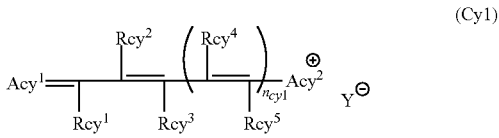

(Cy1)

In the formula, Y represents an anion.

$Rcy^1$ to $Rcy^5$ each independently represent a hydrogen atom or a substituent, and at least one of $Rcy^1$, $Rcy^2$, $Rcy^3$, $Rcy^4$ or $Rcy^5$ represents a group represented by Formula (1) or a group represented by Formula (10).

Two of $Rcy^1$ to $Rcy^5$ may be bonded to each other to form a ring.

$n_{cy1}$ represents an integer of 0 to 2, and in a case where $n_{cy1}$ represents 2, a plurality of $Rcy^4$'s may be the same as or different from each other and a plurality of Rcy⁵'s may be the same as or different from each other, Acy¹ and Acy² each independently represent an aryl group or a heterocyclic group.

Examples of the anion represented by Y include a halide ion (Cl⁻, Br⁻, I⁻), a p-toluenesulfonate ion, an ethyl sulfate ion, $PF_6^-$, $B(CN)_4^-$, $BF_4^-$, $B(C_6F_5)_4^-$, $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyanoborate anion.

Rcy¹ to Rcy⁵ each independently represent a hydrogen atom or a substituent. Examples of the substituent include the above-described substituent T, the above-described group represented by Formula (1), and the above-described group represented by Formula (10). In Formula (Cy1), at least one of Rcy¹ or Rcy⁵ represents a group represented by Formula (1) or a group represented by Formula (10). In particular, from the viewpoint of excellent light fastness, it is preferable that a group positioned in the meso-position (center) of a methine chain is a group represented by Formula (1) or a group represented by Formula (10). For example, in a case where $n_{cy1}$ in Formula (Cy1) is 1, it is preferable that Rcy³ positioned in the meso-position (center) of a methine chain is a group represented by Formula (1) or a group represented by Formula (10). In Formula (Cy1), two of Rcy¹ to Rcy⁵ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

$n_{cy1}$ represents an integer of 0 to 2 and preferably 1 or 2. In a case where $n_{cy1}$ represents 2, a plurality of Rcy⁴'s may be the same as or different from each other and a plurality of Rcy⁵'s may be the same as or different from each other.

The number of carbon atoms in the aryl group represented by Acy¹ and Acy² is preferably 6 to 48, more preferably 6 to 22, and still more preferably 6 to 12. It is preferable that the heterocyclic group represented by Acy¹ and Acy² is a 5- or 6-membered heterocyclic group. In addition, the heterocyclic group is preferably a monocyclic or fused heterocyclic group composed of 2 to 8 rings, more preferably a monocycle or a monocyclic or fused heterocyclic group composed of 2 to 4 rings, still more preferably a monocyclic or fused heterocyclic group composed of 2 or 3 rings, and still more preferably a monocyclic or fused heterocyclic group composed of 2 rings. Examples of a heteroatom included in the ring of the heterocyclic group include a nitrogen atom, an oxygen atom, and a sulfur atom. Among these, a nitrogen atom or a sulfur atom is preferable. The number of heteroatoms constituting the ring of the heterocyclic group is preferably 1 to 3 and more preferably 1 or 2. Acy¹ and Acy² each independently represent preferably a heterocyclic group and more preferably a nitrogen-containing heterocyclic group. Examples of the nitrogen-containing heterocyclic group include an oxazole ring group, an isoxazole ring group, a benzoxazole ring group, a naphthoxazole ring group, an oxazolocarbazole ring group, an oxazolodibenzofuran ring group, a thiazole ring group, a benzothiazole ring group, a naphthothiazole ring group, an indolenine ring group, a benzoindolenine ring group, an imidazole ring group, a benzimidazole ring group, a naphthoimidazole ring group, a quinoline ring group, a pyridine ring group, a pyrrolopyridine ring group, a furopyrrole ring group, an indolizine ring group, an imidazoquinoxaline ring group, and a quinoxaline ring group. The group represented by Acy¹ and Acy² may have a substituent. Examples of the substituent include the substituent T described below, the above-described group represented by Formula (1), and the above-described group represented by Formula (10).

It is preferable that the compound represented by Formula (Cy1) is a compound represented by the following Formula (Cy2) or (Cy3).

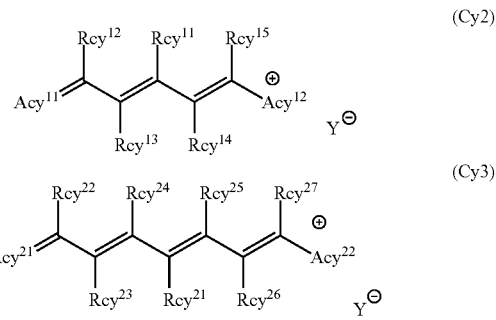

In Formula (Cy2), Y represents an anion.

Rcy¹¹ represents a group represented by Formula (1) or a group represented by Formula (10).

Rcy¹² to Rcy¹⁵ each independently represent a hydrogen atom or a substituent.

Rcy¹² and Rcy¹³, Rcy¹³ and Rcy¹⁴, or Rcy¹⁴ and Rcy¹⁵ may be bonded to each other to form a ring.

Acy¹¹ and Acy¹² each independently represent an aryl group or a heterocyclic group.

In Formula (Cy3), Y represents an anion.

Rcy²¹ represents a group represented by Formula (1) or a group represented by Formula (10).

Rcy²² to Rcy²⁷ each independently represent a hydrogen atom or a substituent.

Rcy²² and Rcy²³, Rcy²³ and Rcy²⁴, Rcy²⁴ and Rcy²⁵, Rcy²⁵ and Rcy²⁶, or Rcy²⁶ and Rcy²⁷ may be bonded to each other to form a ring.

Acy²¹ and Acy²² each independently represent an aryl group or a heterocyclic group.

Y in Formula (Cy2), Acy¹¹ and Acy¹², Y in Formula (Cy3), and Acy²¹ and Acy²² have the same definitions and the same preferable ranges as those of Y in Formula (Cy1) and Acy¹ and Acy². Examples of the substituent represented by Rcy¹² to Rcy¹⁵ in Formula (Cy2) and the substituent represented by Rcy²² to Rcy²⁷ in Formula (Cy3) include the above-described substituent T, the above-described group represented by Formula (1), and the above-described group represented by Formula (10).

In Formula (Cy2), Rcy¹² and Rcy¹³, Rcy¹³ and Rcy¹⁴, or Rcy¹⁴ and Rcy¹⁵ may be bonded to each other to form a ring. From the viewpoint of excellent light fastness, it is preferable that Rcy¹³ and Rcy¹⁴ are bonded to each other to form a ring. In addition, in Formula (Cy3), Rcy²² and Rcy²³, Rcy²³ and Rcy²⁴, Rcy²⁴ and Rcy²⁵, Rcy²⁵ and Rcy²⁶, or Rcy²⁶ and Rcy²⁷ may be bonded to each other to form a ring. From the viewpoint of excellent light fastness, it is preferable that Rcy²⁴ and Rcy²⁵ are bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include the above-described substituent T.

The cyanine compound can be manufactured using a well-known method of the related art, for example, a method described in JP2015-172004A.

(Croconium Compound)

It is preferable that the croconium compound as the near infrared absorbing colorant A is a compound represented by the following Formula (Cr1).

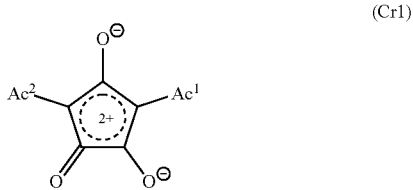

(Cr1)

In the formula, $Ac^1$ and $Ac^2$ each independently represent an aryl group, a heterocyclic group, or a group represented by Formula (Ac-1), and at least one of $Ac^1$ or $Ac^2$ has the group represented by Formula (1) or the group represented by Formula (10) as a substituent.

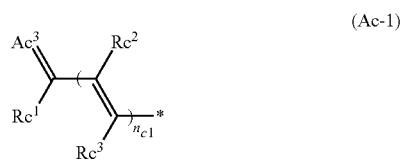

(Ac-1)

In the formula, * represents a bonding site.

$Rc^1$ to $Rc^3$ each independently represent a hydrogen atom or an alkyl group.

$Ac^3$ represents a heterocyclic group.

$n_{c1}$ represents an integer of 0 or more.

$Rc^1$ and $Rc^2$ may be bonded to each other to form a ring.

$Rc^1$ and $Ac^3$ may be bonded to each other to form a ring.

$Rc^2$ and $Rc^3$ may be bonded to each other to form a ring.

In a case where $n_{c1}$ represents 2 or more, a plurality of $Rc^2$'s may be the same as or different from each other and a plurality of $Rc^3$'s may be the same as or different from each other.

The number of carbon atoms in the aryl group represented by $Ac^1$ and $Ac^2$ is preferably 6 to 48, more preferably 6 to 22, and still more preferably 6 to 12.

It is preferable that the heterocyclic group represented by $Ac^1$, $Ac^2$, and $Ac^3$ is a 5- or 6-membered heterocyclic group. In addition, the heterocyclic group is preferably a monocyclic or fused heterocyclic group composed of 2 to 8 rings, more preferably a monocycle or a monocyclic or fused heterocyclic group composed of 2 to 4 rings, still more preferably a monocyclic or fused heterocyclic group composed of 2 or 3 rings, and still more preferably a monocyclic or fused heterocyclic group composed of 2 rings. Examples of a heteroatom included in the ring of the heterocyclic group include a nitrogen atom, an oxygen atom, and a sulfur atom. Among these, a nitrogen atom or a sulfur atom is preferable. The number of heteroatoms constituting the ring of the heterocyclic group is preferably 1 to 3 and more preferably 1 or 2.

$Rc^1$ to $Rc^3$ in Formula (Ac-1) each independently represent a hydrogen atom or an alkyl group. The number of carbon atoms in the alkyl group represented by $Rc^1$ to $Rc^3$ is preferably 1 to 20, more preferably 1 to 15, and still more preferably 1 to 8. The alkyl group may be linear, branched, or cyclic and is preferably linear or branched. It is preferable that $Rc^1$ to $Rc^3$ represent a hydrogen atom.

$n_{c1}$ in Formula (Ac-1) represents an integer of 0 or more. $n_{c1}$ represents preferably an integer of 0 to 2, more preferably 0 or 1, and still more preferably 1.

In Formula (Ac-1), $Rc^1$ and $Rc^2$ may be bonded to each other to form a ring, $Rc^1$ and $Ac^3$ may be bonded to each other to form a ring, and $Rc^2$ and $Rc^3$ may be bonded to each other to form a ring. It is preferable that a linking group for forming the ring is a divalent linking group selected from the group consisting of —CO—, —O—, —NH—, an alkylene group having 1 to 10 carbon atoms, and a combination thereof. The alkylene group as the linking group may be unsubstituted or may have a substituent. Examples of the substituent include a substituent T described below.

In Formula (Cr1), it is preferable that the group represented by $Ac^1$ and $Ac^2$ has a substituent. Examples of the substituent include the above-described substituent T, the above-described group represented by Formula (1), and the above-described group represented by Formula (10). In the compound represented by Formula (Cr1), it is preferable that at least one of $Ac^1$ or $Ac^2$ represents the group represented by Formula (1) or the group represented by Formula (10) as a substituent.

In Formula (Cr1), it is preferable that $Ac^1$ and $Ac^2$ each independently represent an aryl group or a heterocyclic group, or it is preferable that $Ac^1$ and $Ac^2$ each independently represent a group represented by Formula (Ac-1).

As shown below, cations in Formula (Cr1) are present without being localized.

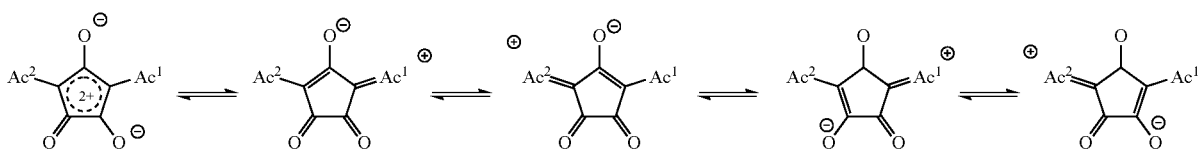

The croconium compound can be manufactured using a well-known method of the related art, for example, a method described in JP2016-079331A.
Specific examples of the near infrared absorbing colorant A include compounds having the following structures.
SQ-1
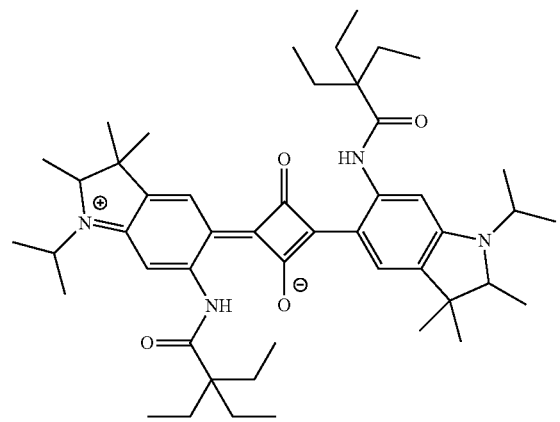
SQ-2
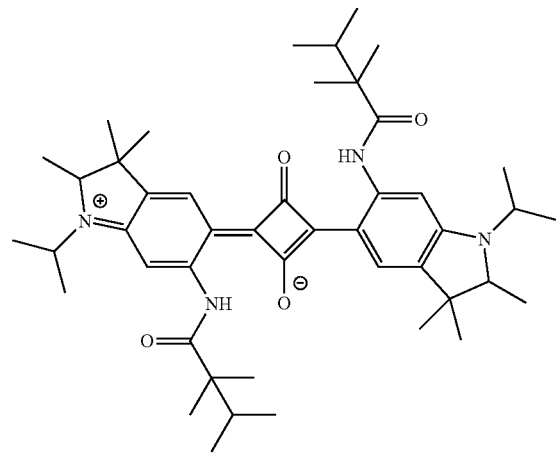
SQ-3
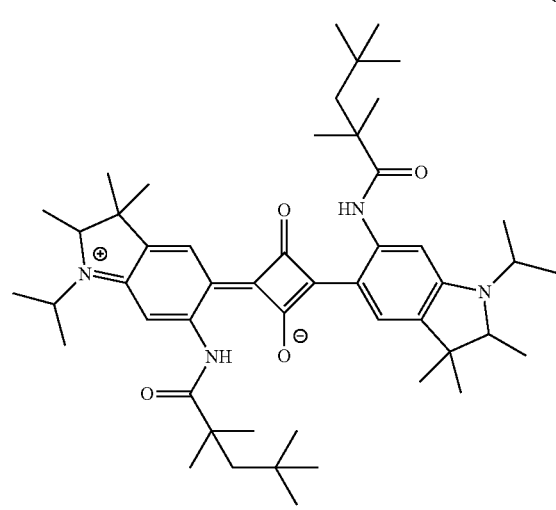
SQ-4
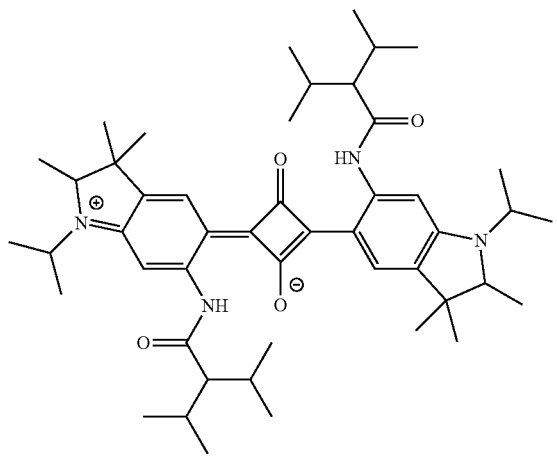
SQ-5
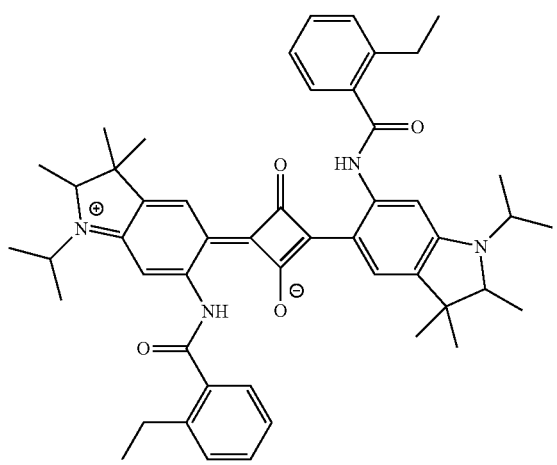
SQ-6
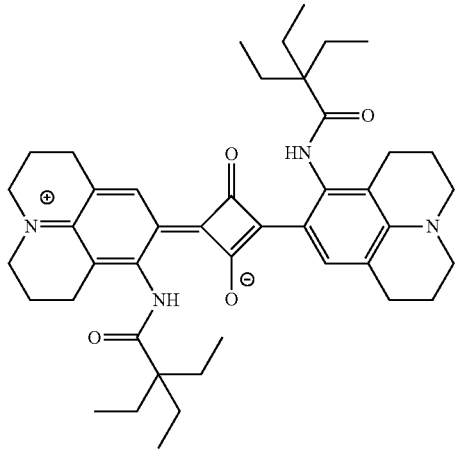

-continued
SQ-7
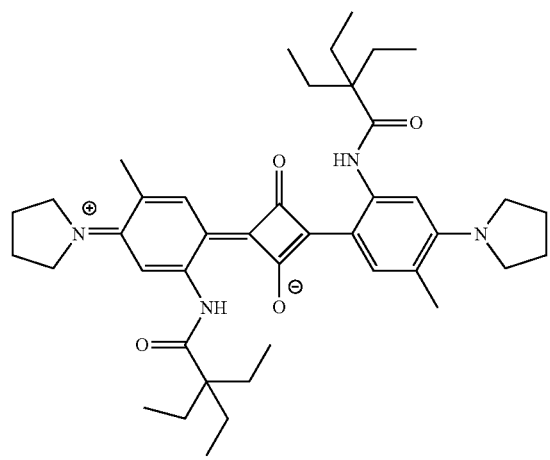
SQ-8
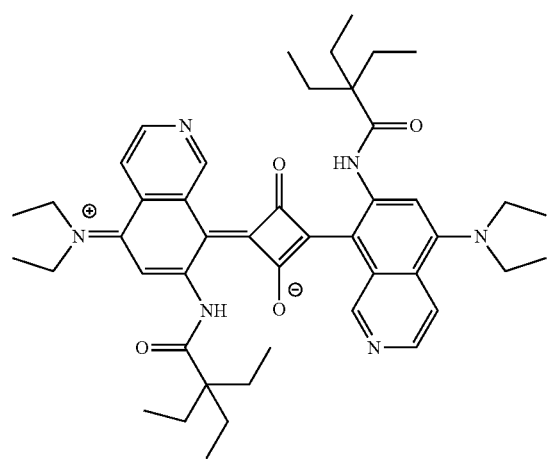
SQ-9
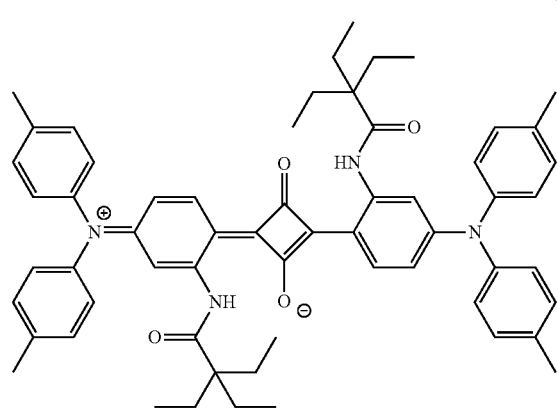
-continued
SQ-10
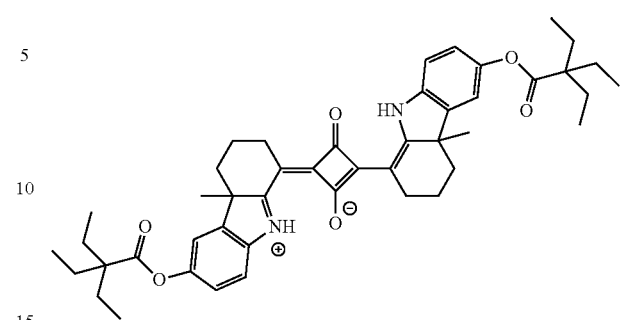
SQ-11
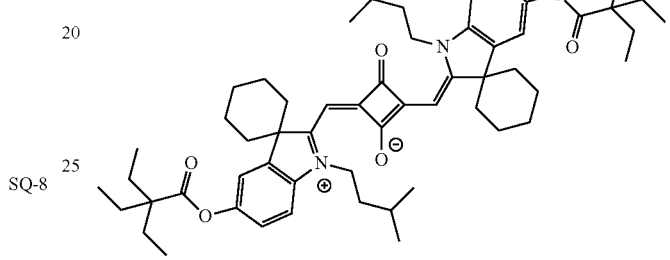
SQ-12
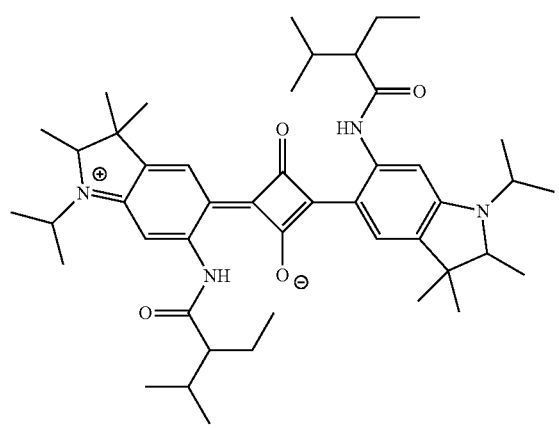
SQ-13
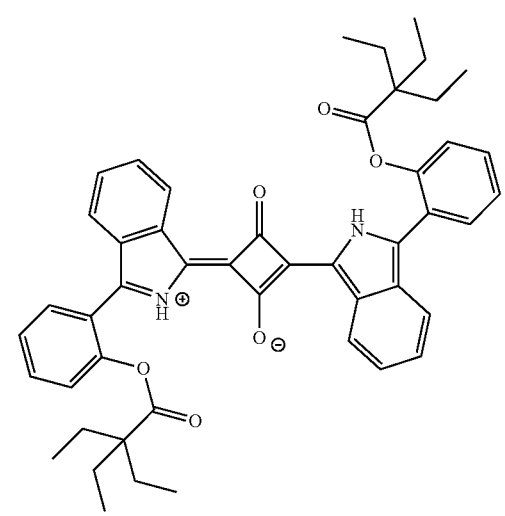

-continued
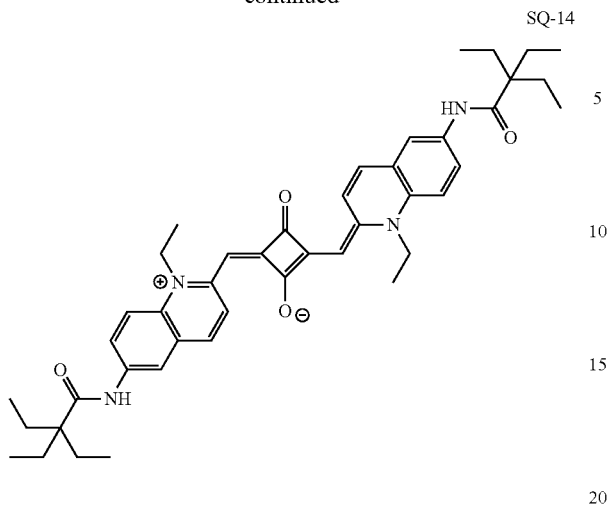
SQ-14
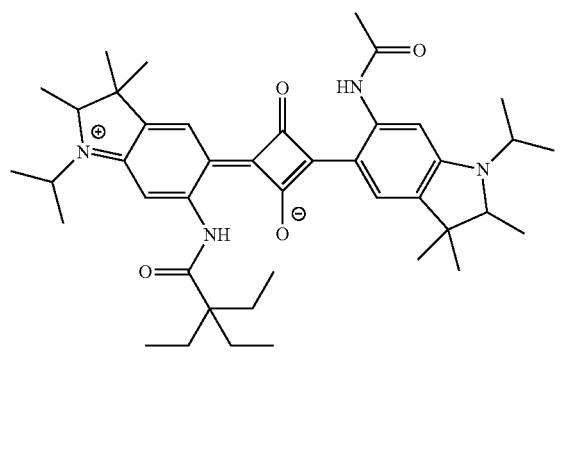
SQ-18
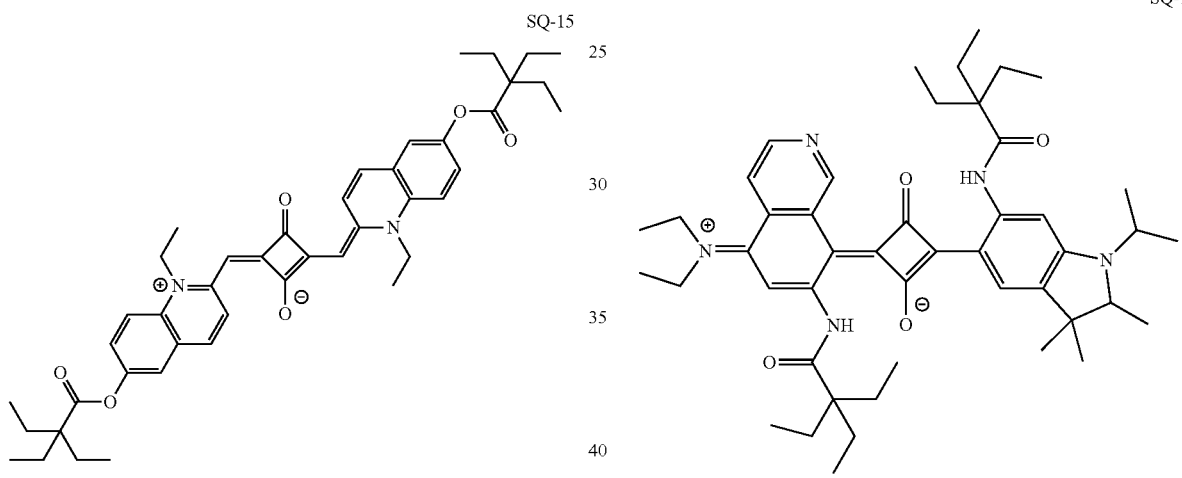
SQ-15
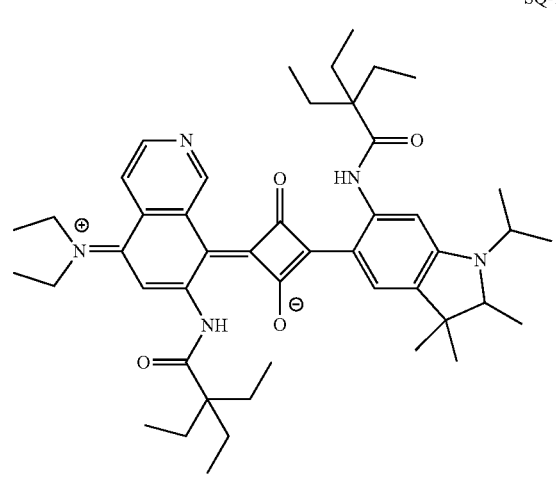
SQ-19
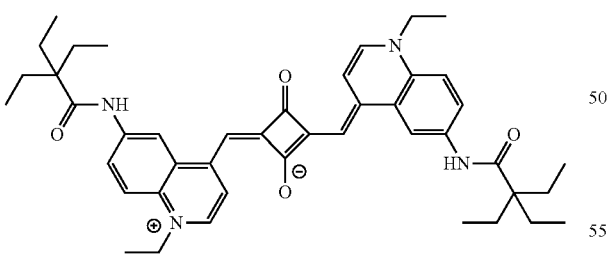
SQ-16
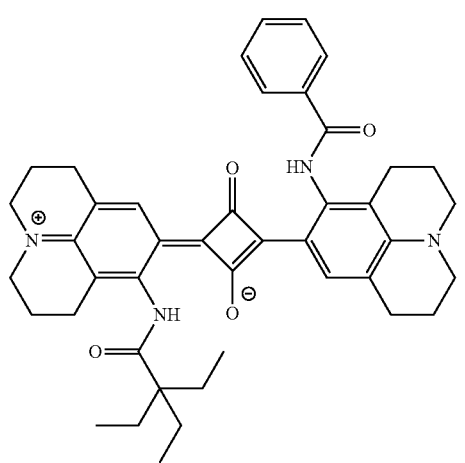
SQ-20
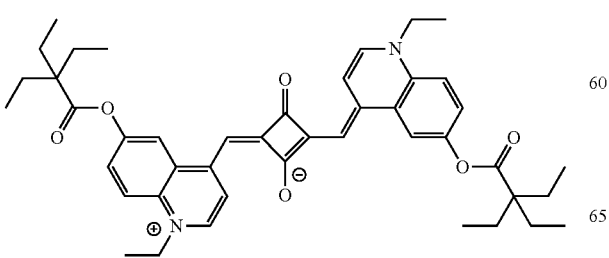
SQ-17

CR-1

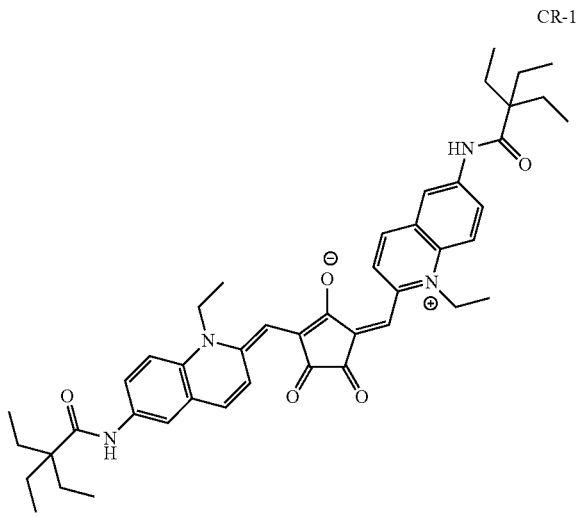

CR-2

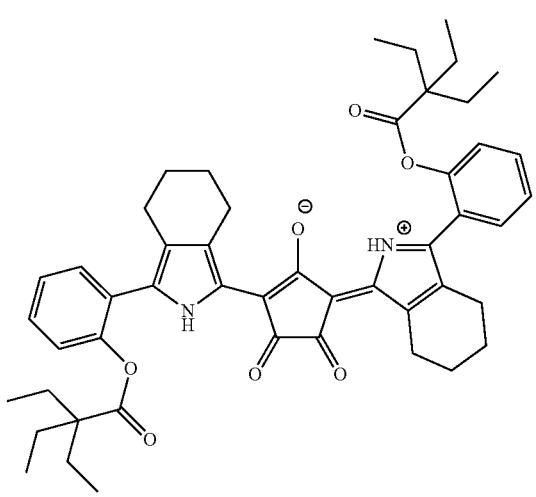

CY-1

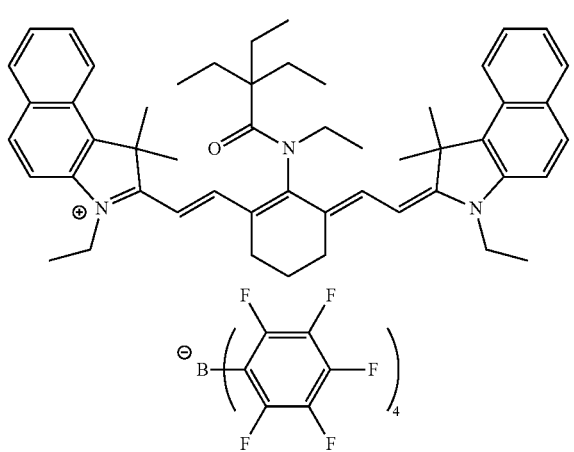

CY-2

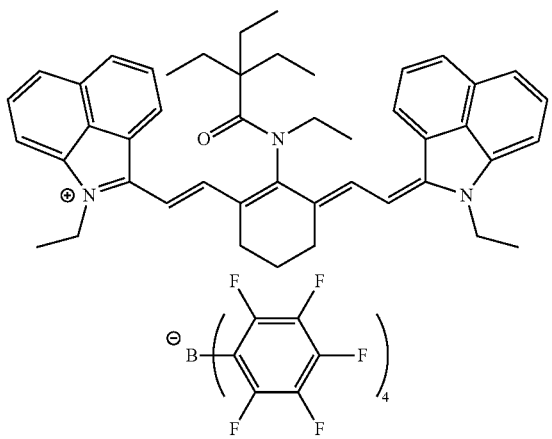

In the curable composition according to the embodiment of the present invention, the content of the near infrared absorbing colorant A is preferably 0.1 to 70 mass % with respect to the total solid content of the curable composition according to the embodiment of the present invention. The lower limit is preferably 0.5 mass % or higher and more preferably 1.0 mass % or higher. The upper limit is preferably 60 mass % or lower, and more preferably 50 mass % or lower. In a case where the curable composition according to the embodiment of the present invention includes two or more near infrared absorbing colorants A, it is preferable that the total content of the two or more near infrared absorbing colorants A is in the above-described range.

<<Other Near Infrared Absorbing Colorant>>

The curable composition according to the embodiment of the present invention may further include near infrared absorbing colorants (other near infrared absorbing colorants) other than the above-described near infrared absorbing colorant A. As the other near infrared absorbing colorant, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, a croconium compound, a phthalocyanine compound, a naphthalocyanine compound, or a diimmonium compound is more preferable, and at least one selected from a pyrrolopyrrole compound, a cyanine compound, a squarylium compound, or a croconium compound is still more preferable. Examples of the pyrrolopyrrole compound include compounds described in paragraphs "0016" to "0058" of JP2009-263614A, compounds described in paragraphs "0037" to "0052" of JP2011-068731A, compounds described in paragraphs "0010" to "0033" of WO2015/166873A, the contents of which are incorporated herein by reference. Examples of the squarylium compound include a compound described in paragraphs "0044" to "0049" of JP2011-208101A, a compound described in paragraphs "0060" and "0061" of JP6065169B, a compound described in paragraph "0040" of WO2016/181987A, a compound described in JP2015-176046A, a compound described in paragraph "0072" of WO2016/190162A, a compound described in paragraphs "0196" to "0228" of JP2016-074649A, a compound described in paragraph "0124" of JP2017-067963A, a compound described in WO2017/135359A, a compound described in JP2017-114956A, a compound described in JP6197940B, and a compound described in WO2016/120166A, the contents of which are incorporated herein by reference. Examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, a compound described in JP2008-088426A, and a compound described in paragraph "0090" of WO2016/190162A, the contents of which are incorporated herein by reference. Examples of the croconium compound include a compound described in JP2017-082029A, the content of which is incorporated herein by reference. Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference. In addition, a compound described in paragraphs JP2016-146619A can also be used as the other near infrared absorbing colorant, the content of which is incorporated herein by reference. Specific examples of the other near infrared absorbing colorant include a compound described in Examples described below.

In a case where the curable composition according to the embodiment of the present invention includes the other near infrared absorbing colorant, the content of the other near infrared absorbing colorant is preferably 0.1 to 70 mass % with respect to the total solid content of the curable composition according to the embodiment of the present invention. The lower limit is preferably 0.5 mass % or higher and more preferably 1.0 mass % or higher. The upper limit is preferably 60 mass % or lower, and more preferably 50 mass % or lower.

In addition, the total content of the other near infrared absorbing colorant and the near infrared absorbing colorant A is preferably 0.1 to 70 mass % with respect to the total solid content of the curable composition according to the embodiment of the present invention. The lower limit is preferably 0.5 mass % or higher and more preferably 1.0 mass % or higher. The upper limit is preferably 60 mass % or lower, and more preferably 50 mass % or lower. In a case where the curable composition according to the embodiment of the present invention includes two or more other near infrared absorbing colorants, it is preferable that the total content of the other near infrared absorbing colorants is in the above-described range.

In addition, the curable composition according to the embodiment of the present invention may include substantially no other near infrared absorbing colorant. A case where the curable composition according to the embodiment of the present invention includes substantially no other near infrared absorbing colorant represents that the content of the other near infrared absorbing colorant is preferably 0.05 mass % or lower, more preferably 0.01 mass % or lower, and still more preferably 0 mass % with respect to the total solid content of the curable composition.

<<Inorganic Particles>>

The curable composition according to the embodiment of the present invention may include inorganic particles. As the inorganic particles, metal oxide particles or metal particles are preferable. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. The details of the inorganic particles can be found in paragraph "0080" of JP2016-006476A, the content of which is incorporated herein by reference. As the inorganic particles, a tungsten oxide compound can also be used. As the tungsten oxide compound, cesium tungsten oxide is preferable. As the cesium tungsten oxide, a compound described in paragraph "0080" of JP2016-006476A or a cesium tungsten oxide described in JP6210180B can also be used.

In a case where the curable composition according to the embodiment of the present invention includes inorganic particles, it is preferable that the content of the inorganic particles is 0.1 to 50 mass % with respect to the total solid content of the curable composition according to the embodiment of the present invention. The lower limit is preferably 0.5 mass % or higher and more preferably 1.0 mass % or higher. The upper limit is preferably 40 mass % or lower and more preferably 30 mass % or lower. In addition, the curable composition according to the embodiment of the present invention may not substantially include inorganic particles. The curable composition according to the embodiment of the present invention not substantially including inorganic particles represents that the content of the inorganic particles is preferably 0.05 mass % or lower, more preferably 0.01 mass % or lower, and still more preferably 0 mass % with respect to the total solid content of the curable composition.

<<Chromatic Colorant>>

The curable composition according to the embodiment of the present invention may include a chromatic colorant. In the present invention, "chromatic colorant" denotes a colorant other than a white colorant and a black colorant. It is preferable that the chromatic colorant is a colorant having a maximum absorption wavelength in a wavelength range of 400 to 650 nm. As the chromatic colorant, a pigment or a dye may be used. It is preferable that the chromatic colorant is a pigment.

The pigment is preferably an organic pigment, and examples thereof are as follows. However, the present invention is not limited to the examples.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phtalocyanine dye, a benzopyran dye, an indigo dye, or a pyrromethene dye can be used. In addition, a polymer of the above-described dyes may be used. In addition, dyes described in JP2015-028144A and JP2015-034966A can also be used.

In a case where the curable composition according to the embodiment of the present invention includes a chromatic colorant, it is preferable that the content of the chromatic colorant is 0.1 to 70 mass % with respect to the total solid content of the curable composition according to the embodiment of the present invention. The lower limit is preferably 0.5 mass % or higher and more preferably 1.0 mass % or higher. The upper limit is preferably 60 mass % or lower, and more preferably 50 mass % or lower.

The content of the chromatic colorant is preferably 10 to 1000 parts by mass and more preferably 50 to 800 parts by mass with respect to 100 parts by mass of the near infrared absorbing colorant.

In addition, the total content of the chromatic colorant, the near infrared absorbing colorant, and the above-described other near infrared absorbing colorant is preferably 1 to 80 mass % with respect to the total solid content of the curable composition according to the embodiment of the present invention. The lower limit is preferably 5 mass % or higher and more preferably 10 mass % or higher. The upper limit is preferably 70 mass % or lower, and more preferably 60 mass % or lower. In a case where the curable composition according to the embodiment of the present invention includes two or more chromatic colorants, it is preferable that the total content of the two or more chromatic colorants is in the above-described range.

In addition, it is also preferable that the curable composition according to the embodiment of the present invention does not substantially include a chromatic colorant. A case where the curable composition according to the embodiment of the present invention does not substantially include a chromatic colorant represents that the content of the chromatic colorant is preferably 0.05 mass % or lower, more preferably 0.01 mass % or lower, and still more preferably 0 mass % with respect to the total solid content of the curable composition.

<<Coloring Material That Allows Transmission of Infrared Light and Blocks Visible Light>>

The curable composition according to the embodiment of the present invention may also include the coloring material that allows transmission of infrared light and blocks visible light (hereinafter, also referred to as "coloring material that blocks visible light").

In the present invention, it is preferable that the coloring material that blocks visible light is a coloring material that absorbs light in a wavelength range of violet to red. In addition, in the present invention, it is preferable that the coloring material that blocks visible light is a coloring material that blocks light in a wavelength range of 450 to 650 nm. In addition, it is preferable that the coloring material that blocks visible light is a coloring material that allows transmission of light in a wavelength range of 900 to 1300 nm.

In the present invention, it is preferable that the coloring material that blocks visible light satisfies at least one of the following requirement (A) or (B).

(A): The coloring material that blocks visible light includes two or more chromatic colorants and forms black using a combination of the two or more chromatic colorants.

(B): The coloring material that blocks visible light includes an organic black colorant.

Examples of the chromatic colorant are as described above. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, JP2012-515234A, WO2014/208348A, and JP2015-525260A. For example, "Irgaphor Black" (manufactured by BASF SE) is available. Examples of the perylene compound include C.I. Pigment Black 31 and 32. Examples of the azomethine compound include a compound described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available.

In a case where a combination of two or more chromatic colorants forms black, examples of the combination of chromatic colorants are as follows.

(1) An aspect in which the coloring material that blocks visible light includes a yellow colorant, a blue colorant, a violet colorant, and a red colorant.

(2) An aspect in which the coloring material that blocks visible light includes a yellow colorant, a blue colorant, and a red colorant.

(3) An aspect in which the coloring material that blocks visible light includes a yellow colorant, a violet colorant, and a red colorant.

(4) An aspect in which the coloring material that blocks visible light includes a yellow colorant and a violet colorant.

(5) An aspect in which the coloring material that blocks visible light includes a green colorant, a blue colorant, a violet colorant, and a red colorant.

(6) An aspect in which the coloring material that blocks visible light includes a violet colorant and an orange colorant.

(7) An aspect in which the coloring material that blocks visible light includes a green colorant, a violet colorant, and a red colorant.

(8) An aspect in which the coloring material that blocks visible light includes a green colorant and a red colorant.

In a case where the curable composition according to the embodiment of the present invention includes the coloring material that blocks visible light, the content of the coloring material that blocks visible light is preferably 60 mass % or lower, more preferably 50 mass % or lower, still more preferably 30 mass % or lower, still more preferably 20 mass % or lower, and still more preferably 15 mass % or lower with respect to the total solid content of the curable composition. The lower limit is, for example, 0.1 mass % or higher or 0.5 mass % or higher.

In addition, it is also preferable that the curable composition according to the embodiment of the present invention does not substantially include the coloring material that blocks visible light. The curable composition substantially not including the coloring material that blocks visible light represents that the content of the coloring material that blocks visible light is preferably 0.05 mass % or lower, more preferably 0.01 mass % or lower, and still more preferably 0% with respect to the total solid content of the curable composition according to the embodiment of the present invention.

<<Pigment Derivative>>

In a case where the curable composition according to the embodiment of the present invention includes a pigment, it is preferable that the curable composition further includes a pigment derivative. Examples of the pigment derivative include a compound having a structure in which a portion of a pigment is substituted with an acidic group, or a basic group. It is preferable that the pigment derivative has an acidic group or a basic group from the viewpoints of dispersibility and dispersion stability. In a case where the curable composition according to the embodiment of the present invention includes the pigment derivative, the content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be efficiently suppressed. As the pigment derivative, one kind may be used alone, or two or more kinds may be used in combination. In a case where two or more pigment derivatives are used in combination, it is preferable that the total content of the two or more pigment derivatives is in the above-described range.

<<Curable Compound>>

The curable composition according to the embodiment of the present invention includes a curable compound. Examples of the curable compound include a crosslinking compound and a resin. The resin may be a non-crosslinking resin (resin not having a crosslinking group) or a crosslinking resin (resin having a crosslinking group). Examples of the crosslinking group include a group having an ethylenically unsaturated bond, a cyclic ether group, a methylol group, an alkoxymethyl group, an alkoxysilyl group, and a chlorosilyl group. Among these, a group having an ethylenically unsaturated bond or a cyclic ether group is preferable, and a group having an ethylenically unsaturated bond is more preferable. Examples of the group having an ethylenically unsaturated bond include a vinyl group, a (meth) allyl group, and a (meth)acryloyl group. Examples of the cyclic ether group include an epoxy group and an oxetanyl group. Among these, an epoxy group is preferable. Examples of the alkoxysilyl group include a monoalkoxysilyl group, a dialkoxysilyl group, and a trialkoxysilyl group. Among these, a dialkoxysilyl group or a trialkoxysilyl group is preferable. In addition, the number of carbon atoms in the alkoxy group of the alkoxysilyl group is preferably 1 to 5, more preferably 1 to 3, and still more preferably 1 or 2. Examples of the chlorosilyl group include a monochlorosilyl group, a dichlorosilyl group, and a trichlorosilyl group. Among these, a dichlorosilyl group or a trichlorosilyl group is preferable, and a trichlorosilyl group is more preferable.

In the present invention, it is preferable that a compound including at least a resin is used as the curable compound, it is more preferable that a monomer type crosslinking compound including a resin is used as the curable compound, and it is still more preferable that a monomer type crosslinking compound including a resin and a group having an ethylenically unsaturated bond is used as the curable compound.

The content of the curable compound is preferably 0.1 to 80 mass % with respect to the total solid content of the curable composition. The lower limit is preferably 0.5 mass % or higher and more preferably 1 mass % or higher. The upper limit is preferably 70 mass % or lower, more preferably 60 mass % or lower, still more preferably 50 mass % or lower, and still more preferably 40 mass % or lower. The curable composition according to the embodiment of the present invention may include one curable compound or two or more curable compounds. In a case where the curable composition includes two or more curable compounds, it is preferable that the total content of the two or more curable compounds is in the above-described range.

(Crosslinking Compound)

Examples of the crosslinking compound include a compound that has a group having an ethylenically unsaturated bond, a compound having a cyclic ether group, a compound having a methylol group, a compound having an alkoxymethyl group, a compound having an alkoxysilyl group, and a compound having a chlorosilyl group. The crosslinking compound may be a monomer or a resin. The monomer type crosslinking compound that has a group having an ethylenically unsaturated bond can be preferably used as a radically polymerizable compound. In addition, the compound having a cyclic ether group, the compound having a methylol group, and the compound having an alkoxymethyl group can be preferably used as a cationically polymerizable compound.

The molecular weight of the monomer type crosslinking compound is preferably lower than 2000, more preferably 100 or higher and lower than 2000, and still more preferably 200 or higher and lower than 2000. The upper limit is, for example, preferably 1500 or lower. The weight-average molecular weight (Mw) of the resin type (polymer type) crosslinking compound is preferably 2,000 to 2,000,000. The upper limit is preferably 1,000,000 or lower and more preferably 500,000 or lower. The lower limit is preferably 3,000 or higher and more preferably 5,000 or higher.

Examples of the resin type crosslinking compound include an epoxy resin and a resin which includes a repeating unit having a crosslinking group. Examples of the repeating unit having a crosslinking group include the following Formulae (A2-1) to (A2-4).

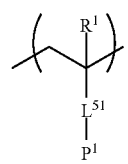

(A2-1)

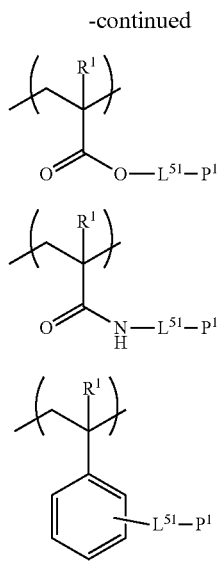

R¹ represents a hydrogen atom or an alkyl group. The number of carbon atoms in the alkyl group is preferably 1 to 5, more preferably 1 to 3, and still more preferably 1. It is preferable that R¹ represents a hydrogen atom or a methyl group.

$L^{51}$ represents a single bond or a divalent linking group. Examples of the divalent linking group include an alkylene group, an arylene group, —O—, —S—, —CO—, —COO—, —OCO—, —SO$_2$—, —NR$^{10}$— (R$^{10}$ represents a hydrogen atom or an alkyl group and preferably a hydrogen atom), and a group consisting of a combination thereof. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

P¹ represents a crosslinking group. Examples of the crosslinking group include a group having an ethylenically unsaturated bond, a cyclic ether group, a methylol group, an alkoxymethyl group, an alkoxysilyl group, and a chlorosilyl group.

The compound which has a group having an ethylenically unsaturated bond is preferably a (meth)acrylate compound having 3 to 15 functional groups and more preferably a (meth)acrylate compound having 3 to 6 functional groups. As the compound which has a group having an ethylenically unsaturated bond, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a compound having a structure in which the (meth)acryloyl group is bonded through an ethylene glycol residue and/or a propylene glycol residue is preferable. In addition, oligomers of the above-described examples can be used. In addition, examples of the compound which includes a group having an ethylenically unsaturated bond include compounds described in paragraphs "0034" to "0038" of JP2013-253224A and paragraph "0477" of JP2012-208494A (corresponding to paragraph "0585" of US2012/0235099A), the contents of which are incorporated herein by reference. In addition, as the compound that has a group having an ethylenically unsaturated bond, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), or ARONIX M-350 and TO-2349 (manufactured by Toagosei Co., Ltd.) can also be used.

The compound which includes a group having an ethylenically unsaturated bond may further have an acid group such as a carboxyl group, a sulfo group, or a phosphate group. Examples of a commercially available product of the compound include ARONIX series (for example, M-305, M-510, or M-520, manufactured by Toagosei Co., Ltd.).

A compound having a caprolactone structure is also preferable as the compound which includes a group having an ethylenically unsaturated bond. Examples of the compound having a caprolactone structure can be found in paragraphs "0042" to "0045" of JP2013-253224A, the content of which is incorporated herein by reference. As the compound having a caprolactone structure, for example, KAYARAD DPCA series (manufactured by Nippon Kayaku Co., Ltd.) is commercially available, and examples thereof include DPCA-20, DPCA-30, DPCA-60, and DPCA-120.

As the compound which has a group having an ethylenically unsaturated bond, a compound which has a group having an ethylenically unsaturated bond and an alkyleneoxy group can also be used. As the compound, a compound which has a group having an ethylenically unsaturated bond, an ethyleneoxy group, and/or a propyleneoxy group is preferable, a compound which has a group having an ethylenically unsaturated bond and an ethyleneoxy group is more preferable, and a trifunctional to hexafunctional (meth)acrylate compound having 4 to 20 ethyleneoxy groups is still more preferable. Examples of a commercially available product include SR-494 (manufactured by Sartomer) which is a tetrafunctional (meth)acrylate having four ethyleneoxy groups, and KAYARAD TPA-330 (manufactured by Nippon Kayaku Co., Ltd.) which is a trifunctional (meth)acrylate having three isobutyleneoxy groups.

As the compound which has a group having an ethylenically unsaturated bond, a urethane acrylate described in JP1973-041708B (JP-S48-041708B), JP1976-037193A (JP-S51-037193A), JP1990-032293B (JP-H2-032293B), or JP1990-016765B (JP-H2-016765B), or a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) is also preferable. In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) can be used. Examples of a commercially available product of the polymerizable compound include UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

In addition, as the compound which has a group having an ethylenically unsaturated bond, a compound described in JP2017-048367A, JP6057891B, JP6031807B, or JP2017-194662A can also be used. In addition, for example, 8UH-1006 or 8UH-1012 (manufactured by Taisei Fine Chemical Co., Ltd.) or LIGHT ACRYLATE POB-A0 (manufactured by Kyoeisha Chemical Co., Ltd.) is also preferably used.

In a case where the curable composition according to the embodiment of the present invention includes the compound which includes a group having an ethylenically unsaturated bond, the content of the compound which includes a group having an ethylenically unsaturated bond is preferably 0.1 to 50 mass % with respect to the total solid content of the curable composition. For example, the lower limit is more preferably 0.5 mass % or higher and still more preferably 1 mass % or higher. For example, the upper limit is more preferably 40 mass % or lower and still more preferably 30 mass % or lower.

In addition, the content of the monomer type compound which has a group having an ethylenically unsaturated bond is preferably 0.1 to 50 mass % with respect to the total solid content of the curable composition. For example, the lower limit is more preferably 0.5 mass % or higher and still more preferably 1 mass % or higher. For example, the upper limit is more preferably 40 mass % or lower and still more preferably 30 mass % or lower.

Examples of the compound having a cyclic ether group include a monofunctional or polyfunctional glycidyl ether compound, a polyfunctional aliphatic glycidyl ether compound, and a resin which has a repeating unit having a cyclic ether group. It is preferable that the compound having a cyclic ether group is a compound having an epoxy group (hereinafter, also referred to as "epoxy compound").

It is preferable that the epoxy compound is a compound having 1 to 100 epoxy groups in one molecule. The upper limit of the number of epoxy groups is, for example, 10 or less or 5 or less. The lower limit of the number of epoxy groups is preferably 2 or more.

The epoxy compound may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the epoxy compound is preferably 2000 to 100000. The upper limit of the weight-average molecular weight is preferably 10000 or lower, more preferably 5000 or lower, and still more preferably 3000 or lower.

The details of the compound having a cyclic ether group can be found in, for example, paragraph "0191" JP2012-155288A, the content of which is incorporated herein by reference. In addition, as the compound having a cyclic ether group, a compound described in JP2017-179172A can also be used. In addition, examples of a commercially available product of the compound having a cyclic ether group include a polyfunctional aliphatic glycidyl ether compound such as DENACOL EX-212L, EX-214L, EX-216L, EX-321L, or EX-850L (all of which are manufactured by Nagase ChemteX Corporation). The above-described examples are low-chlorine products, but a commercially available product which is not a low-chlorine product such as EX-212, EX-214, EX-216, EX-321, or EX-850 can also be used. In addition, ADEKA RESIN EP-4000S, EP-4003S, EP-4010S, and EP-4011S (all of which are manufactured by Adeka Corporation); NC-2000, NC-3000, NC-7300, XD-1000, EPPN-501, and EPPN-502 (all of which are manufactured by Adeka Corporation); JER1031S, CELLOXIDE 2021P, CELLOXIDE 2081, CELLOXIDE 2083, CELLOXIDE 2085, EHPE 3150, EPOLEAD PB 3600, and EPOLEAD PB 4700 (all of which are manufactured by Daicel Corporation); CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (all of which are manufactured by Daicel Corporation); JER-157S65, JER-152, JER-154, and JER-157S70 (all of which are manufactured by Mitsubishi Chemical Corporation); and ARONE OXETANE OXT-121, OXT-221, OX-SQ, and PNOX (all of which are manufactured by Toagosei Co., Ltd.) can be used. In addition, ADEKA GLYCILOL ED-505 (manufactured by Adeka Corporation, an epoxy group-containing monomer), MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used.

In a case where the curable composition according to the embodiment of the present invention includes the compound having a cyclic ether group, the content of the compound having a cyclic ether group is preferably 0.1 to 50 mass % with respect to the total solid content of the curable composition. For example, the lower limit is more preferably 0.5 mass % or higher and still more preferably 1 mass % or higher. For example, the upper limit is more preferably 40 mass % or lower and still more preferably 30 mass % or lower.

Examples of the compound having a methylol group (hereinafter, also referred to as "methylol compound") include a compound in which a methylol group is bonded to a nitrogen atom or a carbon atom which forms an aromatic ring. In addition, examples of the compound having an alkoxymethyl group (hereinafter, also referred to as "alkoxymethyl compound") include a compound in which an alkoxymethyl group is bonded to a nitrogen atom or a carbon atom which forms an aromatic ring. As the compound in which an alkoxymethyl group or a methylol group is bonded to a nitrogen atom, for example, alkoxy methylated melamine, methylolated melamine, alkoxy methylated benzoguanamine, methylolated benzoguanamine, alkoxy methylated glycoluril, methylolated glycoluril, alkoxy methylated urea, or methylolated urea is preferable. In addition, the details can be found in paragraphs "0134" to "0147" of JP2004-295116A or paragraphs "0095" to "0126" of JP2014-089408A, the contents of which are incorporated herein by reference.

In a case where the curable composition according to the embodiment of the present invention includes a methylol compound, the content of the methylol compound is preferably 0.1% to 50 mass % with respect to the total solid content of the curable composition. For example, the lower limit is more preferably 0.5 mass % or higher and still more preferably 1 mass % or higher. For example, the upper limit is more preferably 40 mass % or lower and still more preferably 30 mass % or lower.

In a case where the curable composition according to the embodiment of the present invention includes an alkoxymethyl compound, the content of the alkoxymethyl compound is preferably 0.1% to 50 mass % with respect to the total solid content of the curable composition. For example, the lower limit is more preferably 0.5 mass % or higher and still more preferably 1 mass % or higher. For example, the upper limit is more preferably 40 mass % or lower and still more preferably 30 mass % or lower.

Examples of the compound having an alkoxysilyl group and the compound having a chlorosilyl group include methyltrimethoxysilane, dimethyldimethoxysilane, phenyltrimethoxysilane, methyltriethoxysilane, dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, 3-isocyanatepropyltriethoxysilane, methyltrichlorosilane, ethyltrichlorosilane, phenyltrichlorosilane, dichloro(methyl)phenyl silane, dimethyldichlorosilane, and diethyldichlorosilane. In addition, for example, a resin which has a repeating unit having an alkoxysilyl group or a resin which has a repeating unit having a chlorosilyl group can also be used. Examples of a commercially available product of the silane coupling agent include KBM-13, KBM-22, KBM-103, KBE-13, KBE-22, KBE-103, KBM-3033, KBE-3033, KBM-3063, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, and KBE-9007 (all of which are manufactured by Shin-Etsu Chemical Co., Ltd.).

In a case where the curable composition according to the embodiment of the present invention includes the compound having an alkoxysilyl group, the content of the compound having an alkoxysilyl group is preferably 0.1 to 50 mass % with respect to the total solid content of the curable composition. For example, the lower limit is more preferably 0.5 mass % or higher and still more preferably 1 mass % or higher. For example, the upper limit is more preferably 40 mass % or lower and still more preferably 30 mass % or lower.

In a case where the curable composition according to the embodiment of the present invention includes the compound having a chlorosilyl group, the content of the compound having a chlorosilyl group is preferably 0.1 to 50 mass % with respect to the total solid content of the curable composition. For example, the lower limit is more preferably 0.5 mass % or higher and still more preferably 1 mass % or higher. For example, the upper limit is more preferably 40 mass % or lower and still more preferably 30 mass % or lower.

(Resin)

The curable composition according to the embodiment of the present invention may include a resin as the curable compound. It is preferable that the curable compound includes at least a resin. The resin can also be used as a dispersant. The resin which is used to disperse the pigments and the like will also be referred to as a dispersant. However, the above-described uses of the resin are merely exemplary, and the resin can be used for purposes other than the uses. The resin having a crosslinking group also corresponds to the crosslinking compound.

The weight-average molecular weight (Mw) of the resin is preferably 2,000 to 2,000,000. The upper limit is preferably 1,000,000 or lower and more preferably 500,000 or lower. The lower limit is preferably 3,000 or higher and more preferably 5,000 or higher.

Examples of the resin include a compound including a repeating unit. Specific examples of the resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, a siloxane resin, and a urethane resin. Among these resins, one kind may be used alone, or a mixture of two or more kinds may be used. As the cyclic olefin resin, a norbornene resin can be preferably used from the viewpoint of improving heat resistance. Examples of a commercially available product of the norbornene resin include ARTON series (for example, ARTON F4520, manufactured by JSR Corporation). Examples of a commercially available product of the polyimide resin include NEOPULIM (registered trade name, manufactured by Mitsubishi Gas Chemical Company Inc.; for example, C3450). Examples of the epoxy resin include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound. In addition, for example, as the epoxy resin, MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used. Examples of the urethane resin include 8UH-1006 or 8UH-1012 (manufactured by Taisei Fine Chemical Co., Ltd.). In addition, as the resin, a resin described in Examples of WO2016/088645A, a resin described in JP2017-057265A, a resin described in JP2017-032685A, a resin described in JP2017-075248A, a resin described in JP2017-066240A, or a resin described in JP2017-167513A can also be used, the contents of which are incorporated herein by reference. In addition, as the resin, a resin having a fluorene skeleton can also be preferably used. Examples of the resin having a fluorene skeleton include a resin having the following structure. In the following structural formula, A represents a residue of a carboxylic dianhydride selected from pyromellitic dianhydride, benzophenone tetracarboxylic dianhydride, biphenyl tetracarboxylic dianhydride, or diphenyl ether tetracarboxylic dianhydride, and M represents a phenyl group or a benzyl group. The details of the resin having a fluorene skeleton can be found in US2017/0102610A, the content of which is incorporated herein by reference.

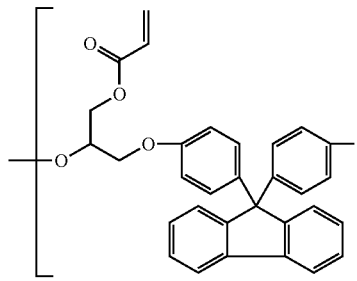
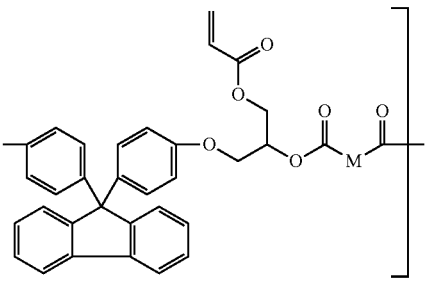

The weight-average molecular weight (Mw) of the resin is preferably 2,000 to 2,000,000. The upper limit is preferably 1,000,000 or lower and more preferably 500,000 or lower. The lower limit is preferably 3,000 or higher and more preferably 5,000 or higher. In addition, in a case where the resin is an epoxy resin, the weight-average molecular weight (Mw) of the epoxy resin is preferably 100 or higher and more preferably 100 to 2,000,000. The upper limit is preferably 1,000,000 or lower and more preferably 500,000 or lower. The lower limit is more preferably 200 or higher.

The resin used in the present invention may have an acid group. Examples of the acid group include a carboxyl group, a phosphate group, a sulfo group, and a phenolic hydroxy group. Among these, a carboxyl group is preferable. Among these acid groups, one kind may be used alone, or two or more kinds may be used in combination. The resin having an acid group can also be used as an alkali-soluble resin. It is preferable that the resin having an acid group is a resin which includes a repeating unit having a carboxyl group at a side chain.

The resin having an acid group may further include a repeating unit having a crosslinking group. In a case where the resin having an acid group further includes the repeating unit having a crosslinking group, the content of the repeating unit having a crosslinking group is preferably 10 to 90 mol %, more preferably 20 to 90 mol %, and still more preferably 20 to 85 mol % with respect to all the repeating units. In addition, the content of the repeating unit having an acid group is preferably 1% to 50 mol %, more preferably 5% to 40 mol %, and still more preferably 5% to 30 mol % with respect to all the repeating units.

It is also preferable that the resin having an acid group includes a repeating unit derived from monomer components including a compound represented by the following Formula (ED1) and/or a compound represented by the following Formula (ED2) (hereinafter, these compounds will also be referred to as "ether dimer").

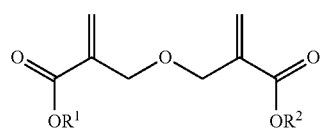

(ED1)

In Formula (ED1), $R^1$ and $R^2$ each independently represent a hydrogen atom or a hydrocarbon group having 1 to 25 carbon atoms which may have a substituent.

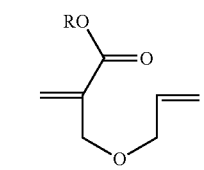

(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph "0317" of JP2013-029760A, the content of which is incorporated herein by reference. Among these ether dimers, one kind may be used alone, or two or more kinds may be used in combination.

It is also preferable that the resin having an acid group includes a repeating unit which is derived from a compound represented by the following Formula (X).

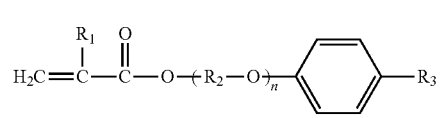

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference. In addition, as the resin having an acid group, a commercially available product may also be used. Examples of the commercially available product include ACRYBASE FF-426 (manufactured by Fujikura Kasei Co., Ltd.).

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

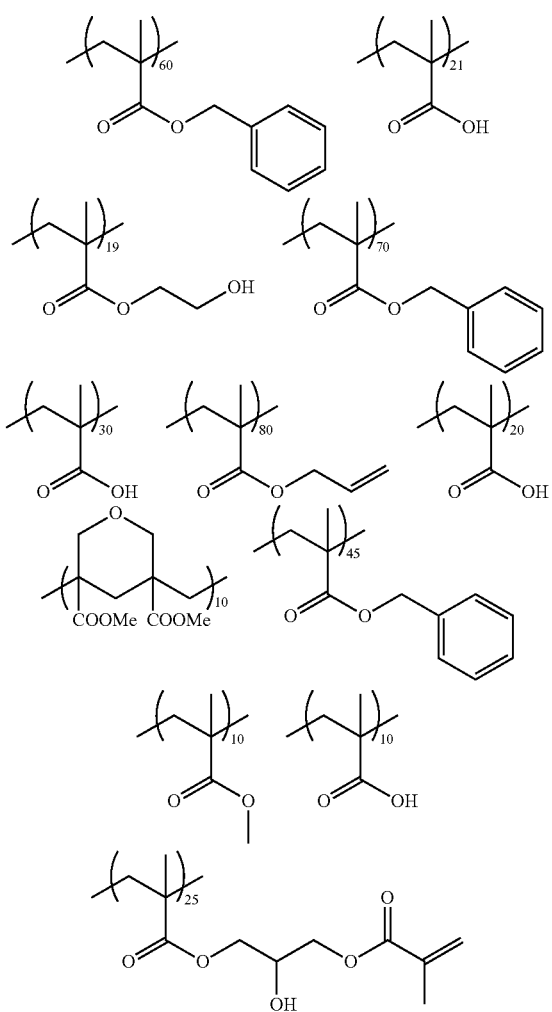

The curable composition according to the embodiment of the present invention may include a resin as a dispersant. Examples of the dispersant include an acidic dispersant (acidic resin) and a basic dispersant (basic resin). Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin used as the dispersant is a graft copolymer. Since the graft copolymer has affinity to the solvent due to the graft chain, the pigment dispersibility and the dispersion stability over time are excellent. The details of the graft copolymer can be found in the description of paragraphs "0025" to "0094" of JP2012-255128A, the content of which is incorporated herein by reference.

It is preferable that the resin used as the dispersant is an oligoimine dispersant having a nitrogen atom at at least either a main chain or a side chain. It is preferable that the oligoimine dispersant is a resin which includes a structural unit having a partial structure X with a functional group (pKa: 14 or lower) and a side chain including a side chain Y having 40 to 10,000 atoms and has a basic nitrogen atom at at least either a main chain or a side chain. The basic nitrogen atom is not particularly limited as long as it is a nitrogen atom exhibiting basicity. The oligoimine dispersant can be found in the description of paragraphs "0102" to "0174" of JP2012-255128A, the content of which is incorporated herein by reference.

The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

In a case where the curable composition according to the embodiment of the present invention includes a resin, it is preferable that the content of the resin is 1 to 80 mass % with respect to the total solid content of the curable composition. The lower limit is preferably 5 mass % or higher, more preferably 10 mass % or higher, still more preferably 15 mass % or higher, and still more preferably 20 mass % or higher. The upper limit is preferably 70 mass % or lower, more preferably 60 mass % or lower, still more preferably 50 mass % or lower, and still more preferably 40 mass % or lower. In addition, the content of the resin having an acid group is preferably 0.1 to 50 mass % with respect to the total solid content of the curable composition. The lower limit is preferably 0.5 mass % or higher, more preferably 1 mass % or higher, still more preferably 2 mass % or higher, and still more preferably 3 mass % or higher. The upper limit is more preferably 30 mass % or lower, and still more preferably 20 mass % or lower. In addition, in a case where the curable composition includes a dispersant as the resin, the content of the dispersant is preferably 0.1 to 40 mass % with respect to the total solid content of the curable composition. The upper limit is preferably 20 mass % or lower, and more preferably 10 mass % or lower. The lower limit is preferably 0.5 mass % or higher and more preferably 1 mass % or higher. The content of the dispersant is preferably 1 to 100 parts by mass with respect to 100 parts by mass of the pigment. The upper limit is preferably 80 parts by mass or less and more preferably 75 parts by mass or less. The lower limit is preferably 2.5 parts by mass or more and more preferably 5 parts by mass or more.

The curable composition according to the embodiment of the present invention may include one resin or two or more resins. In a case where the curable composition includes two or more resins, it is preferable that the total content of the two or more resins is in the above-described range.

<<Photopolymerization Initiator>>

In a case where the curable composition according to the embodiment of the present invention includes a radically polymerizable compound as the curable compound, it is preferable that the curable composition further includes a photopolymerization initiator. The photopolymerization initiator is not particularly limited as long as it has an ability to initiate the polymerization reaction of the radically polymerizable compound, and can be selected from well-known photopolymerization initiators. It is preferable that the photopolymerization initiator is a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. In addition, from the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. The details of the photopolymerization initiator can be found in paragraphs "0065" to "0111" of JP2014-130173A, the content of which is incorporated herein by reference.

Examples of a commercially available product of the α-hydroxyketone compound include IRGACURE-184, DAROCUR-1173, IRGACURE-500, IRGACURE-2959, and IRGACURE-127 (all of which are manufactured by BASF SE). Examples of a commercially available product of the α-aminoketone compound include IRGACURE-907, IRGACURE-369, IRGACURE-379, and IRGACURE-379EG (all of which are manufactured by BASF SE). Examples of a commercially available product of the acylphosphine compound include IRGACURE-819, and DAROCUR-TPO (all of which are manufactured by BASF SE).

Examples of the oxime compound include a compound described in JP2001-233842A, a compound described in JP2000-080068A, a compound described in JP2006-342166A, a compound described in J. C. S. Perkin II (1979, pp. 1653 to 1660), a compound described in J. C. S. Perkin II (1979, pp. 156 to 162), a compound described in Journal of Photopolymer Science and Technology (1995, pp. 202 to 232), a compound described in JP2000-066385A, a compound described in JP2000-080068A, a compound described in JP2004-534797A, a compound described in JP2006-342166A, a compound described in JP2017-019766A, a compound described in JP6065596B, a compound described in WO2015/152153A, and a compound described in WO2017/051680A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A). As the oxime compound, a compound having no colorability or a compound having high transparency that is not likely to be discolored can also be preferably used. Examples of a commercially available product of the oxime compound include ADEKA ARKLS NCI-730, NCI-831, and NCI-930 (all of which are manufactured by Adeka Corporation).

In the present invention, an oxime compound having a fluorene ring can also be used as the photopolymerization initiator. Specific examples of the oxime compound having a fluorene ring include a compound described in JP2014-137466A. The content of this specification is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content of this specification is incorporated herein by reference.

In the present invention, as the photopolymerization initiator, an oxime compound having a nitro group can be used. It is preferable that the oxime compound having a nitro group is a dimer. Specific examples of the oxime compound having a nitro group include a compound described in paragraphs "0031" to "0047" of JP2013-114249A and paragraphs "0008" to "0012" and "0070" to "0079" of JP2014-137466A, a compound described in paragraphs "0007" to "0025" of JP4223071B, and ADEKA ARKLS NCI-831 (manufactured by Adeka Corporation).

In the present invention, as the photopolymerization initiator, an oxime compound having a benzofuran skeleton can also be used. Specific examples include OE-01 to OE-75 described in WO2015/036910A.

Hereinafter, specific examples of the oxime compound which are preferably used in the present invention are shown below, but the present invention is not limited thereto.

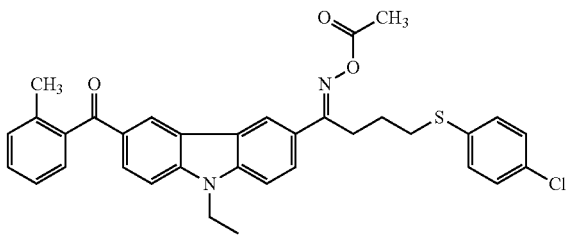

(C-1)

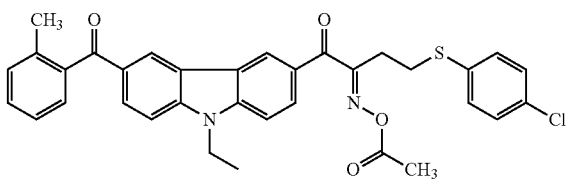

(C-2)

-continued
(C-3)
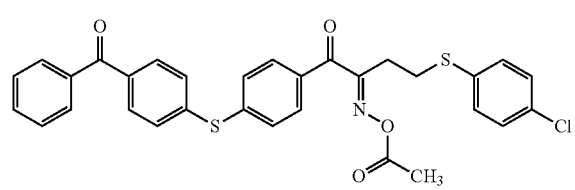
(C-4)
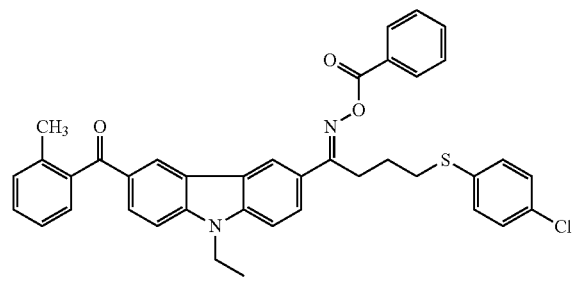
(C-5)
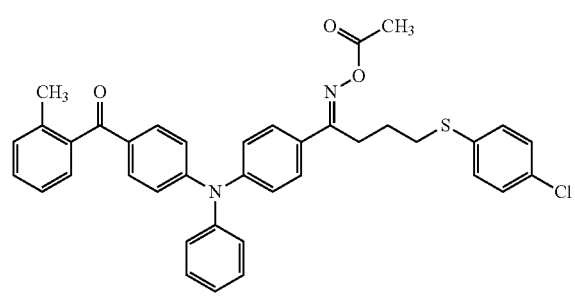
(C-6)
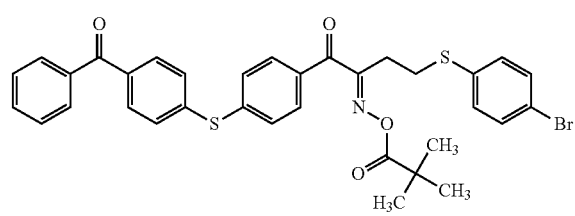
(C-7)
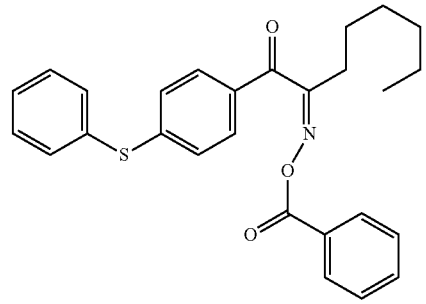
-continued
(C-8)
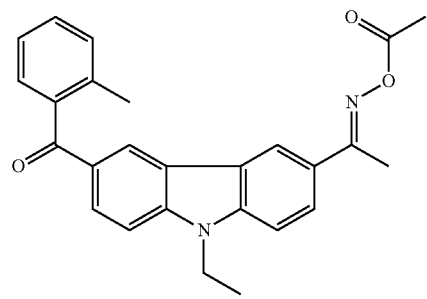
(C-9)
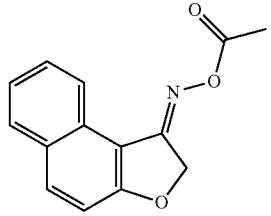
(C-10)
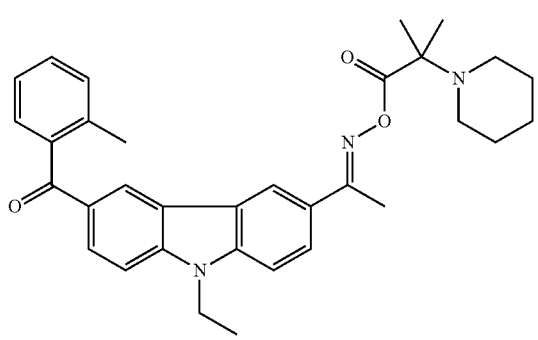
(C-11)
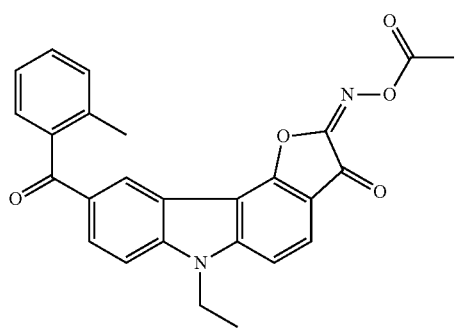
(C-12)
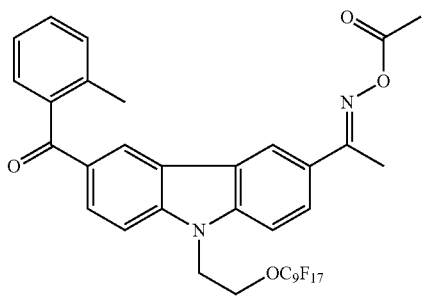

(C-13)

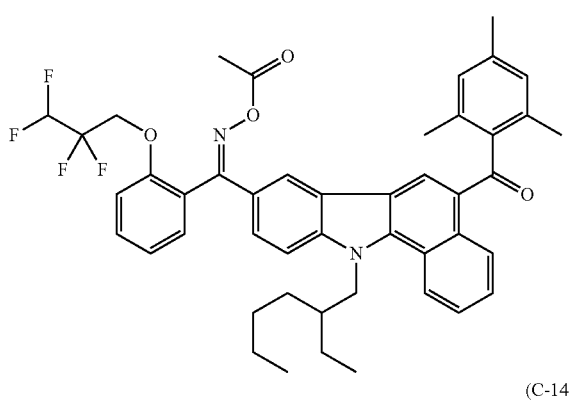

(C-14)

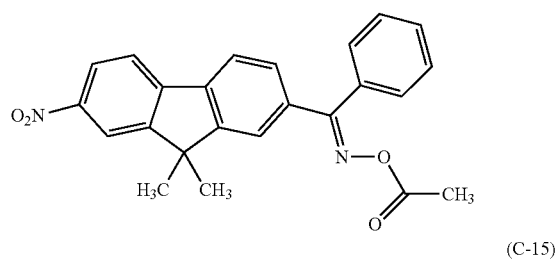

(C-15)

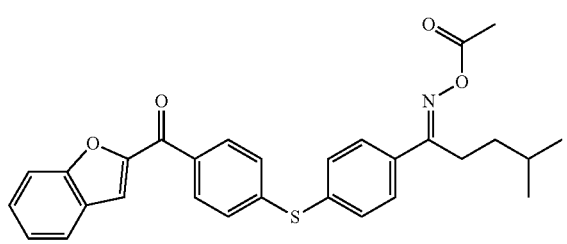

(C-16)

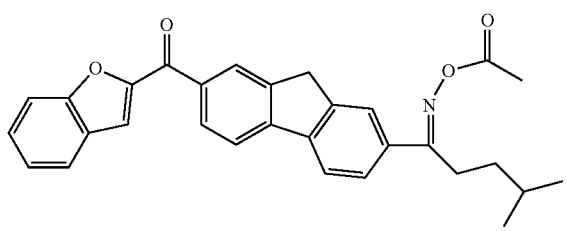

The oxime compound is preferably a compound having a maximum absorption wavelength in a wavelength range of 350 to 500 nm and more preferably a compound having a maximum absorption wavelength in a wavelength range of 360 to 480 nm. In addition, the molar absorption coefficient of the oxime compound at a wavelength of 365 nm or 405 nm is preferably high, more preferably 1,000 to 300,000, still more preferably 2,000 to 300,000, and still more preferably 5,000 to 200,000 from the viewpoint of sensitivity. The molar absorption coefficient of the compound can be measured using a well-known method. For example, it is preferable that the molar absorption coefficient can be measured using a spectrophotometer (Cary-5 spectrophotometer, manufactured by Varian Medical Systems, Inc.) and ethyl acetate as a solvent at a concentration of 0.01 g/L.

In the present invention, as the photopolymerization initiator, a photopolymerization initiator having two functional groups or three or more functional groups may be used. By using this photopolymerization initiator, two or more active species such as radicals are generated from one molecule of the photopolymerization initiator. Therefore, excellent sensitivity can be obtained. In addition, in a case where a compound having an asymmetric structure is used, crystallinity deteriorates, solubility in a solvent or the like is improved, precipitation is not likely to occur over time, and temporal stability of the composition can be improved. Specific examples of the above-described photopolymerization initiator include a dimer of an oxime compound described in JP2010-527339A, JP2011-524436A, WO2015/004565A, paragraphs "0417" to "0412" of JP2016-532675A, or paragraphs "0039" to "0055" of WO2017/033680A, a compound (E) and a compound (G) described in JP2013-522445A, Cmpd 1 to 7 described in WO2016/034963A, an oxime ester photoinitiator described in paragraph "0007" of JP2017-523465A, a photoinitiator described in paragraphs "0020" to "0033" of JP2017-167399A, and a photopolymerization initiator (A) described in paragraphs "0017" to "0026" of JP2017-151342A.

It is preferable that the photopolymerization initiator includes an oxime compound and an α-aminoketone compound. By using the oxime compound and the α-aminoketone compound in combination, the developability is improved, and a pattern having excellent rectangularity can be easily formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the curable composition. In a case where the content of the photopolymerization initiator is in the above-described range, higher sensitivity and pattern formability can be obtained. The curable composition according to the embodiment of the present invention may include one photopolymerization initiator or two or more photopolymerization initiators. In a case where the curable composition includes two or more photopolymerization initiators, it is preferable that the total content of the two or more photopolymerization initiators is in the above-described range.

<<Acid Generator>>

The curable composition according to the embodiment of the present invention may include an acid generator. In particular, in a case where the curable composition according to the embodiment of the present invention includes a compound having a cyclic ether group or a cationically polymerizable compound as the curable compound, it is preferable that the curable composition according to the embodiment of the present invention includes an acid generator. As the acid generator, a compound (photoacid generator) which generates an acid by light irradiation is preferable. Examples of the acid generator include compounds which are decomposed by light irradiation to generate an acid including: an onium salt compound such as a diazonium salt, a phosphonium salt, a sulfonium salt, or an iodonium salt; and a sulfonate compound such as imidosulfonate, oximesulfonate, diazodisulfone, disulfone, or o-nitrobenzyl sulfonate. The kind, specific compounds, and preferable examples of the acid generator can be found in the description of a compound in paragraphs "0066" to "0122" of JP2008-013646A, the content of which is also applicable to the present invention. In addition, examples of a compound which can be preferably used as the acid generator in the present invention include compounds represented by the following Formulae (b1), (b2), and (b3).

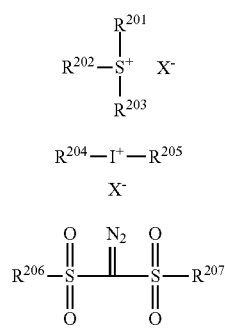

In Formula (b1), $R^{201}$, $R^{202}$, and $R^{203}$ each independently represent an organic group. $X^-$ represents a non-nucleophilic anion, preferably a sulfonate anion, a carboxylate anion, a bis(alkylsulfonyl)amide anion, a tris(alkylsulfonyl)methide anion, $BF_4^-$, $PF_6^-$, or $SbF_6^-$, and more preferably $BF_4^-$, $PF_6^-$, or $SbF_6^-$.

Examples of a commercially available product of the acid generator include WPAG-469 (manufactured by Wako Pure Chemical Industries, Ltd.) and CPI-100P (manufactured by San-Apro Ltd.).

The content of the acid generator is preferably 0.1 to 50 mass %, more preferably 0.5 to 30 mass %, and still more preferably 0.5 to 20 mass % with respect to the total solid content of the curable composition. The curable composition according to the embodiment of the present invention may include one acid generator or two or more acid generators. In a case where the curable composition includes two or more acid generators, it is preferable that the total content of the two or more acid generators is in the above-described range.

<<Crosslinking Aid>>

It is preferable that the curable composition according to the embodiment of the present invention includes a crosslinking aid in order to promote a reaction of the crosslinking compound. Examples of the crosslinking aid include at least one selected from a polyfunctional thiol, an alcohol, an amine, or a carboxylic acid.

Examples of the polyfunctional thiol as the crosslinking aid include a compound having two or more thiol groups in a molecule. The polyfunctional thiol is preferably a secondary alkanethiol and more preferably a compound having a structure represented by the following Formula (T1).

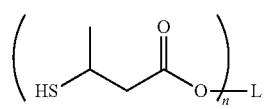

Formula (T1)

In Formula (T1), n represents an integer of 2 to 4, and L represents a divalent to tetravalent linking group.

In Formula (T1), it is preferable that a linking group L is an aliphatic group having 2 to 12 carbon atoms, and it is more preferable that n represents 2 and L represents an alkylene group having 2 to 12 carbon atoms. Specific examples of the polyfunctional thiol include compounds represented by the following Structural Formulae (T2) to (T4). In particular, a compound represented by Structural Formula (T2) is preferable. Among these polyfunctional thiols, one kind may be used alone, or two or more kinds may be used in combination.

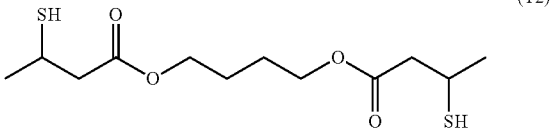

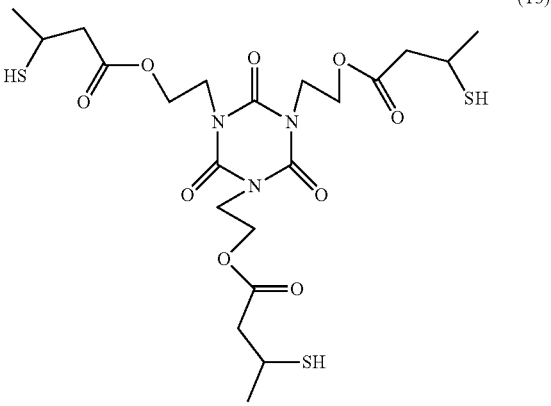

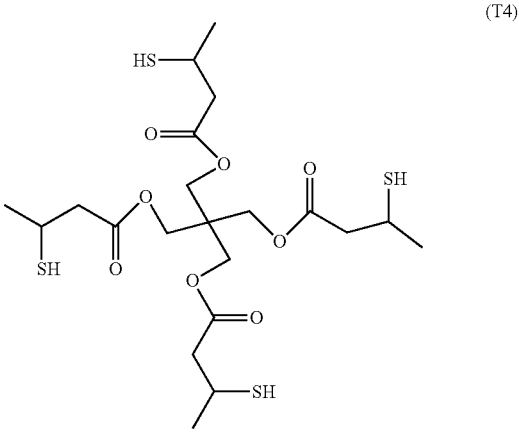

The amine as the crosslinking aid is preferably polyamine and more preferably diamine. Examples of the amine include hexamethylenediamine, triethylenetetramine, and polyethyleneimine.

The alcohol as the crosslinking aid is preferably polyhydric alcohol and more preferably diol. Examples of the alcohol include a polyether diol compound, a polyester diol compound, and a polycarbonate diol compound. Specific examples of the alcohol can be found in paragraphs "0128" to "0163" and "0172" of JP2013-253224A, the content of which is incorporated herein by reference.

Examples of the carboxylic acid as the crosslinking aid include 3,3',4,4'-biphenyltetracarboxylic anhydride, maleic acid, phthalic acid, and trimellitic acid. In addition, a carboxy group-containing epoxy curing agent described in JP2017-036379A can also be used.

The content of the crosslinking aid is preferably 1 to 1000 parts by mass, more preferably 1 to 500 parts by mass, and still more preferably 1 to 200 parts by mass with respect to 100 parts by mass of the crosslinking compound. The curable composition according to the embodiment of the present invention may include one crosslinking aid or two or more crosslinking aids. In a case where the curable composition includes two or more crosslinking aids, it is preferable that the total content of the two or more crosslinking aids is in the above-described range.

<<Catalyst>>

The curable composition according to the embodiment of the present invention may include a catalyst. In particular, in a case where a compound having an alkoxysilyl group or a chlorosilyl group is used as the curable compound, it is preferable that the curable composition includes the catalyst. According to this aspect, a sol-gel reaction is promoted, and a stronger film can be easily obtained. Examples of the catalyst include an acid catalyst and a base catalyst. Examples of the acid catalyst include hydrochloric acid, nitric acid, sulfuric acid, sulfurous acid, hydrogen sulfide, perchloric acid, hydrogen peroxide, carbonic acid, a carboxylic acid such as formic acid or acetic acid, a substituted carboxylic acid in which R in a structural formula represented by RCOOH is substituted with another element or a substituent, a sulfonic acid such as benzenesulfonic acid, and phosphoric acid. In addition, Lewis acid such as aluminum chloride, aluminum acetylacetonate, zinc chloride, tin chloride, a boron trifluoride diethyl ether complex, or iodotrimethylsilane may be used. Examples of the base catalyst include an ammonia base compound such as ammonia water and an organic amine such as ethylamine or aniline. In addition, as the catalyst, a catalyst described in paragraphs "0070" to "0076" of JP2013-201007A can also be used.

The content of the catalyst is preferably 0.1 to 100 parts by mass, more preferably 0.1 to 50 parts by mass, and still more preferably 0.1 to 20 parts by mass with respect to 100 parts by mass of the crosslinking compound. The curable composition according to the embodiment of the present invention may include one catalyst or two or more catalysts. In a case where the curable composition includes two or more catalysts, it is preferable that the total content of the two or more catalysts is in the above-described range.

<<Solvent>>

The curable composition according to the embodiment of the present invention may include a solvent. Examples of the solvent include an organic solvent. The solvent is not particularly limited as long as it satisfies the solubility of the respective components and the application properties of the curable composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide or 3-butoxy-N,N-dimethylpropanamide is also preferable from the viewpoint of improving solubility. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass % with respect to the total mass of the curable composition according to the embodiment of the present invention. The lower limit is preferably 20 mass % or higher, more preferably 30 mass % or higher, still more preferably 40 mass % or higher, still more preferably 50 mass % or higher, and still most preferably 60 mass % or higher.

In addition, it is preferable that the curable composition according to the embodiment of the present invention does not substantially include an environmentally regulated material from the viewpoint of environmental regulations. In the present invention, not substantially including the environmentally regulated material represents that the content of the environmentally regulated material in the curable composition is 50 mass ppm or lower, preferably 30 mass ppm or lower, more preferably 10 mass ppm or lower, and still more preferably 1 mass ppm or lower. Examples of the environmentally regulated material include: benzene; an alkylbenzene such as toluene or xylene; and a halogenated benzene such as chlorobenzene. These compounds are registered as environmentally regulated materials based on Registration Evaluation Authorization and Restriction of Chemicals (REACH) regulation, Pollutant Release and Transfer Register (PRTR) method, Volatile Organic Compound (VOC) regulation, and the like, and the amount thereof used and a handling method thereof are strictly regulated. These compounds are used as solvents in a case where each of the components or the like used in the curable composition according to the embodiment of the present invention is manufactured, and may be incorporated into the curable composition as residual solvents. From the viewpoints of safety for humans and consideration of the environment, it is preferable that these materials are reduced as much as possible. Examples of a method of reducing the environmentally regulated material include a method of distilling off the environmentally regulated material from the system by heating or depressurizing the system such that the temperature of the system is higher than or equal to a boiling point of the environmentally regulated material. In addition, in a case where a small amount of environmentally regulated material is removed by distillation, a method of azeotroping the environmentally regulated material with a solvent having the same boiling point as that of the corresponding solvent is also useful to increase the efficiency. In addition, in a case where a radically polymerizable compound is included, in order to suppress intermolecular crosslinking caused by the progress of a radical polymerization reaction during distillation under reduced pressure, a polymerization inhibitor or the like may be added for distillation under reduced pressure. This distillation method can be performed in, for example, any of a step of raw materials, a step of a reaction product (for example, a resin solution or a polyfunctional monomer solution after polymerization) obtained from a reaction of the raw materials, or a step of a curable composition prepared by mixing these compounds with each other.

<<Polymerization Inhibitor>>

The curable composition according to the embodiment of the present invention may include a polymerization inhibitor. Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), a N-nitrosophenylhydroxyamine salt (for example, an ammonium salt or a cerium (III) salt), and 2,2,6,6-tetramethylpiperidine-1-oxyl. The content of the polymerization inhibitor is preferably 0.001% to 5 mass % with respect to the total solid content of the curable composition according to the embodiment of the present invention. The curable composition according to the embodiment of the present invention may include one polymerization inhibitor or two or more polymerization inhibitors. In a case where the curable composition includes two or more polymerization inhibitors, it is preferable that the total content of the two or more polymerization inhibitors is in the above-described range.

<<Surfactant>>

The curable composition according to the embodiment of the present invention may include a surfactant. The details of the surfactant can be found in paragraphs "0238" to "0245" of WO2015/166779A, the content of which is incorporated herein by reference. Examples of the surfactant include various surfactants such as a fluorine surfactant, a nonionic surfactant, a cationic surfactant, an anionic surfactant, and a silicone surfactant. Among these, a fluorine surfactant is preferable. By the curable composition according to the embodiment of the present invention containing a fluorine surfactant, liquid characteristics (in particular, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties.

Specific examples of the fluorine surfactant include a surfactant described in paragraphs "0060" to "0064" of JP2014-041318A (paragraphs "0060" to "0064" of corresponding WO2014/17669) and a surfactant described in paragraphs "0117" to "0132" of JP2011-132503A. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound having a molecular structure which has a functional group having a fluorine atom can be used. In the acrylic compound, the functional group having a fluorine atom is cut and a fluorine atom is volatilized during heat application. Examples of the fluorine surfactant include MEGAFACE DS series (manufactured by DIC Corporation, for example, MEGAFACE DS-21).

In addition, as the fluorine surfactant, a copolymer of a fluorine-containing vinyl ether compound having a fluorinated alkyl group or a fluorinated alkylene ether group and a hydrophilic vinyl ether compound can also be used. The details of this fluorine surfactant can be found in JP2016-216602A, the content of which is incorporated herein by reference.

As the fluorine surfactant, a block polymer can be used. Examples of the block polymer include a compound described in JP2011-089090A. In addition, as the fluorine surfactant, a fluorine-containing copolymer can be preferably used, the fluorine-containing copolymer including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

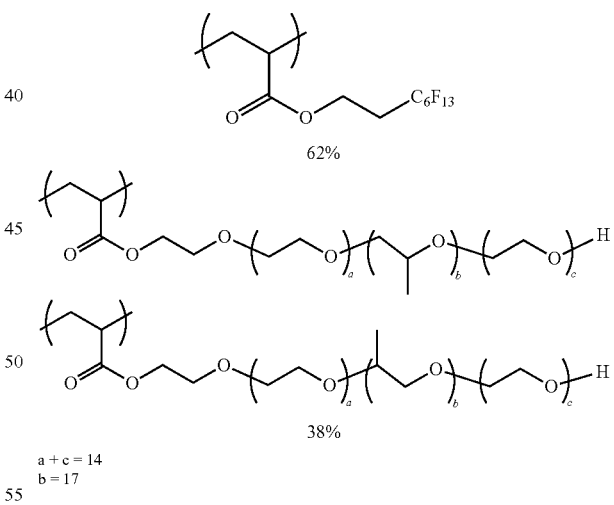

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing copolymer which has a repeating unit having an ethylenically unsaturated group at a side chain can be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. In addition, as the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLFINE E1010, SURFYNOL 104, 400, and 440 (all of which are manufactured by Nissin Chemical Co., Ltd.).

The content of the surfactant is preferably 0.001 mass % to 5.0 mass % and more preferably 0.005 to 3.0 mass % with respect to the total solid content of the curable composition. The curable composition according to the embodiment of the present invention may include one surfactant or two or more surfactants. In a case where the curable composition includes two or more surfactants, it is preferable that the total content of the two or more surfactants is in the above-described range.

<<Ultraviolet Absorber>>

The curable composition according to the embodiment of the present invention may include an ultraviolet absorber. Examples of the ultraviolet absorber include a conjugated diene compound, an aminobutadiene compound, a methyldibenzoyl compound, a coumarin compound, a salicylate compound, a benzophenone compound, a benzotriazole compound, an acrylonitrile compound, an azomethine compound, an indole compound, and a triazine compound. The details of the ultraviolet absorber can be found in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Examples of a commercially available product of the ultraviolet absorber include UV-503 (manufactured by Daito Chemical Co., Ltd.). In addition, examples of the benzotriazole compound include MYUA series (manufactured by Miyoshi Oil&Fat Co., Ltd.; The Chemical Daily, Feb. 1, 2016).

The content of the ultraviolet absorber is preferably 0.01 to 10 mass % and more preferably 0.01 to 5 mass % with respect to the total solid content of the curable composition. The curable composition according to the embodiment of the present invention may include one ultraviolet absorber or two or more ultraviolet absorbers. In a case where the curable composition includes two or more ultraviolet absorbers, it is preferable that the total content of the two or more ultraviolet absorbers is in the above-described range.

<<Other Additives>>

In addition to the above-described components, various additives, for example, a filler, an adhesion accelerator, an antioxidant, a potential antioxidant, or an aggregation inhibitor can be optionally added to the curable composition according to the embodiment of the present invention. Examples of the additives include additives described in paragraphs "0155" and "0156" of JP2004-295116A. The content of this specification is incorporated herein by reference. In addition, examples of the antioxidant include a phenol compound, a phosphorus compound, (for example, a compound described in paragraph "0042" of JP2011-090147A), and a thioether compound. In addition, an antioxidant described in WO2017/164024A can also be used. Examples of a commercially available product of the antioxidant include ADEKA STAB series (AO-20, AO-30, AO-40, AO-50, AO-50F, AO-60, AO-60G, AO-80, and AO-330, manufactured by Adeka Corporation). The potential antioxidant is a compound in which a portion that functions as the antioxidant is protected by a protective group and this protective group is desorbed by heating the compound at 100° C. to 250° C. or by heating the compound at 80° C. to 200° C. in the presence of an acid/a base catalyst. Examples of the potential antioxidant include a compound described in WO2014/021023A, WO2017/030005A, and JP2017-008219A. Examples of a commercially available product of the potential antioxidant include ADEKA ARKLS GPA-5001 (manufactured by Adeka Corporation).

For example, in a case where a film is formed by coating, the viscosity (23° C.) of the curable composition according to the embodiment of the present invention is preferably 1 to 100 mPa·s. The lower limit is more preferably 2 mPa·s or higher and still more preferably 3 mPa·s or higher. The upper limit is more preferably 50 mPa·s or lower, still more preferably 30 mPa·s or lower, and still more preferably 15 mPa·s or lower.

A storage container of the curable composition according to the embodiment of the present invention is not particularly limited, and a well-known storage container can be used. In addition, as the storage container, in order to suppress infiltration of impurities into the raw materials or the curable composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A. In addition, storage conditions of the curable composition according to the embodiment of the present invention are not particularly limited, and a well-known method can be used. In addition, a method described in JP2016-180058A can also be used.

With the curable composition according to the embodiment of the present invention including the above-described near infrared absorbing colorant A, a film having excellent near infrared blocking properties and visible transparency can also be manufactured. A near infrared cut filter is desired to have excellent near infrared blocking properties and visible transparency. Therefore, the curable composition according to the embodiment of the present invention can be more preferably used as a composition for forming a near infrared cut filter. In addition, by the curable composition according to the embodiment of the present invention including the coloring material that blocks visible light, an infrared transmitting filter that can allow transmission of only near infrared light at a specific wavelength or higher can also be formed. Accordingly, the curable composition according to the embodiment of the present invention can also be preferably used as a composition for forming an infrared transmitting filter.

<Method of Preparing Curable Composition>

The curable composition according to the embodiment of the present invention can be prepared by mixing the above-described components with each other. During the preparation of the curable composition, all the components may be dissolved or dispersed in a solvent at the same time to prepare the curable composition. Optionally, two or more solutions or dispersion liquids to which the respective components are appropriately added may be prepared, and the solutions or dispersions may be mixed with each other during use (during application) to prepare the curable composition.

In addition, it is preferable that a process of dispersing the pigment is provided in order to prepare the curable composition. Examples of a mechanical force used for dispersing the pigment in the process of dispersing the pigment include compression, squeezing, impact, shearing, and cavitation. Specific examples of a unit that realizes the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the pigment using a sand mill (beads mill), it is preferable that the process is performed under conditions for increasing the pulverization efficiency, for example, by using beads having a small size and increasing the filling rate of the beads. In addition, it is preferable that coarse particles are removed by filtering, centrifugal separation, and the like after pulverization. In addition, as the process and the disperser for dispersing the pigment, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be used. In addition, in the process of dispersing the pigment, a pigment may be refined in a salt milling step. A material, a device, process conditions, and the like used in the salt milling step can be found in, for example, JP2015-194521A and JP2012-046629A.

During the preparation of the curable composition, it is preferable that the curable composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is preferably 0.01 to 7.0 μm, more preferably 0.01 to 3.0 μm, and still more preferably 0.05 to 0.5 μm. In a case where the pore size of the filter is in the above-described range, fine foreign matter can be more reliably removed. The pore size value of the filter can refer to a nominal value of a manufacturer of the filter. As the filter, various filters manufactured by Pall Corporation (for example, DFA4201NIEY), Toyo Roshi Kaisha, Ltd., Entegris Japan Co., Ltd. (former Mykrolis Corporation), or Kits Microfilter Corporation can be used.

In addition, it is also preferable that a fibrous filter material is used as the filter. Examples of the fibrous filter material include polypropylene fiber, nylon fiber, and glass fiber. Specific examples of a commercially available product of the fibrous filter material include SBP type series (for example, SBP008), TPR type series (for example, TPR002 or TPR005), and SHPX type series (for example, SHPX003) all of which are manufactured by Roki Techno Co., Ltd.

In a case where a filter is used, a combination of different filters (for example, a first filter and a second filter) may be used. In this case, the filtering using each of the filters may be performed once, or twice or more. In addition, a combination of filters having different pore sizes in the above-described range may be used. In addition, the filtering using the first filter may be performed only on the dispersion liquid, and the filtering using the second filter may be performed on a mixture of the dispersion and other components.

<Near Infrared Absorber>

Next, a near infrared absorber according to the embodiment of the present invention will be described.

The near infrared absorber according to the embodiment of the present invention includes a near infrared absorbing colorant having a group represented by the following Formula (1) or a near infrared absorbing colorant having a group represented by the following Formula (10).

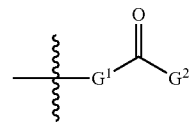

(1)

In Formula (1), $G^1$ represents $NR^{G1}$ or an oxygen atom, $R^{G1}$ represents a hydrogen atom or a monovalent substituent, and $G^2$ represents a monovalent substituent having a -Es' value of 2.4 or higher as a steric parameter.

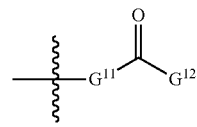

(10)

In Formula (10), represents $NR^{G11}$ or an oxygen atom, $R^{G11}$ represents a hydrogen atom or a monovalent substituent, and $G^{12}$ represents a tertiary alkyl group having 6 or more carbon atoms.

The near infrared absorbing colorant having a group represented by Formula (1) and the near infrared absorbing colorant having a group represented by Formula (10) have the same definitions and the same preferable ranges as those of the above-described near infrared absorbing colorant A of the curable composition according to the embodiment of the present invention.

<Film>

Next, a film according to the embodiment of the present invention will be described. The film according to the embodiment of the present invention is obtained from the above-described curable composition according to the embodiment of the present invention. The film according to the embodiment of the present invention can be preferably used as a near infrared cut filter, an infrared transmitting filter, or the like. The film according to the embodiment of the present invention may be a film having a pattern or a film (flat film) not having a pattern.

The film according to the embodiment of the present invention may be used in a state where it is laminated on a support, or may be peeled off from a support. Examples of the support include a semiconductor substrate such as a silicon and a transparent substrate. The transparent substrate is not particularly limited as long as it is formed of a material that can allow transmission of at least visible light. For example, a substrate formed of a material such as glass, crystal, or a resin can be used. As the material of the transparent substrate, glass is preferable. That is, it is preferable that the transparent substrate is a glass substrate. Examples of the glass include soda-lime glass, borosilicate glass, non-alkali glass, quartz glass, and copper-containing glass. Examples of the copper-containing glass include a phosphate glass including copper and a fluorophosphate glass including copper. Examples of a commercially available product of the copper-containing glass include NF-50 (manufactured by AGC Techno Glass Co., Ltd.). Examples of the crystal include rock crystal, lithium niobate, and sapphire. Examples of the resin include a polyester resin such as polyethylene terephthalate or polybutylene terephthalate, a polyolefin resin such as polyethylene, polypropylene, or an ethylene vinyl acetate copolymer, a norbornene resin, an acrylic resin such as polyacrylate or polymethyl methacrylate, a urethane resin, a vinyl chloride resin, a fluororesin, a polycarbonate resin, a polyvinyl butyral resin, and a polyvinyl alcohol resin. In addition, in order to improve adhesiveness between the support and the film according to the embodiment of the present invention, a underlayer or the like may be provided on a surface of the support.

In a case where the film according to the embodiment of the present invention is used as a near infrared cut filter, it is preferable that the film according to the embodiment of the present invention has a maximum absorption wavelength in a wavelength range of 700 to 1200 nm. In addition, an average transmittance in a wavelength range of 400 to 550 nm is preferably 70% or higher, more preferably 80% or higher, still more preferably 85% or higher, and still more preferably 90% or higher. In addition, a transmittance of in the entire wavelength range of 400 to 550 nm is preferably 70% or higher, more preferably 80% or higher, and still more preferably 90% or higher. In addition, a transmittance at at least one point in a wavelength range of 700 to 1000 nm is preferably 20% or lower, more preferably 15% or lower, and still more preferably 10% or lower.

The film according to the embodiment of the present invention can be used in combination with a color filter that includes a chromatic colorant. The color filter can be manufactured using a coloring composition including a chromatic colorant. Examples of the chromatic colorant include the chromatic colorants described above. The coloring composition may further include, for example, a curable compound, a photopolymerization initiator, a surfactant, a solvent, a polymerization inhibitor, and an ultraviolet absorber. In more detail, for example, the materials described above can be used.

In a case where the film according to the embodiment of the present invention is used as a near infrared cut filter and in combination with a color filter, it is preferable that the color filter is disposed on an optical path of the film according to the embodiment of the present invention. For example, the film according to the embodiment of the present invention and the color filter can be laminated to be used as a laminate. In the laminate, the film according to the embodiment of the present invention and the color filter may be or may not be adjacent to each other in a thickness direction. In a case where the film according to the embodiment of the present invention is not adjacent to the color filter in the thickness direction, the film according to the embodiment of the present invention may be formed on another support other than a support on which the color filter is formed, or another member (for example, a microlens or a planarizing layer) constituting a solid-state imaging element may be interposed between the film according to the embodiment of the present invention and the color filter.

The thickness of the film according to the embodiment of the present invention can be adjusted according to the purpose. The thickness is preferably 20 μm or less, more preferably 10 μm or less, and still more preferably 5 μm or less. For example, the lower limit of the thickness is preferably 0.1 μm or more, more preferably 0.2 μm or more, and still more preferably 0.3 μm or more.

In the present invention, "near infrared cut filter" refers to a filter that allows transmission of light (visible light) in the visible range and blocks at least a part of light (near infrared light) in the near infrared range. The near infrared cut filter may be a filter that allows transmission of light in the entire visible range, or may be a filter that allows transmission of light in a specific wavelength range of the visible range and blocks light in another specific wavelength range of the visible range. In addition, in the present invention, a color filter refers to a filter that allows transmission of light in a specific wavelength range of the visible range and blocks light in another specific wavelength range of the visible range. In addition, in the present invention, "infrared transmitting filter" refers to a filter that blocks visible light and allows transmission of at least a part of near infrared light.

<Film Forming Method>

Next, a film forming method according to the embodiment of the present invention will be described. The film according to the embodiment of the present invention can be formed through a step of applying the curable composition according to the embodiment of the present invention.

A support to which the curable composition is applied is not particularly limited, and examples thereof include a semiconductor substrate such as a silicon and the above-described transparent substrate. For example, an organic film or an inorganic film may be formed on the support. Examples of a material of the organic film include the above-described transparent resin. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the support flat. In addition, in a case where a glass substrate is used as the support, it is preferable that an inorganic film is formed on a surface of the glass substrate or the glass substrate may be dealkalized to be used.

As a method of applying the curable composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (February, 2005, S.B. Research Co., Ltd.) and methods described in JP2003-

262716A, JP2003-185831A, JP2003-261827A, JP2012-126830A, and JP2006-169325A. In addition, the details of the method of applying the curable composition can be found in WO2017/030174A and WO2017/018419A, the content of which is incorporated herein by reference.

A composition layer formed by applying the curable composition may be dried (pre-baked). In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By performing pre-baking at 150° C. or lower, for example, in a case where a photoelectric conversion film of an image sensor is formed of an organic material, the characteristics of the organic material can be effectively maintained. The pre-baking time is preferably 10 to 3000 seconds, more preferably 40 to 2500 seconds, and still more preferably 80 to 220 seconds. Pre-baking can be performed using a hot plate, an oven, or the like.

The composition layer may be further heated (post-baked) after pre-baking. In a case where post-baking is performed, for example, the post-baking temperature is preferably 100° C. to 240° C. From the viewpoint of curing the film, the post-baking temperature is more preferably 180° C. to 240° C. The post-baking time is preferably 2 to 10 minutes and more preferably 4 to 8 minutes. Post-baking can be performed using a hot plate, an oven, or the like.

The film forming method according to the embodiment of the present invention may further include a step of forming a pattern. Examples of a pattern forming method include a pattern forming method using a photolithography method and a pattern forming method using a dry etching method. In a case where the film according to the embodiment of the present invention is used as a flat film, the step of forming a pattern is not necessarily performed. Hereinafter, the step of forming a pattern will be described in detail.

(Case Where Pattern is Formed Using Photolithography Method)

It is preferable that the pattern forming method using a photolithography method includes: a step (exposure step) of exposing the composition layer, which is formed by applying the curable composition according to the embodiment of the present invention to the support, in a pattern shape; and a step (development step) of forming a pattern by removing a non-exposed portion of the composition layer by development.

<<Exposure Step>>

In the exposure step, the composition layer is exposed in a pattern shape. For example, the composition layer is exposed in a pattern shape using a stepper exposure device or a scanner exposure device through a mask having a predetermined mask pattern, thereby exposing a pattern. As a result, an exposed portion can be cured. Examples of radiation (light) used during the exposure include a g-ray and an i-ray. In addition, light having a wavelength of 300 nm or shorter (preferably light having a wavelength of 180 to 300 nm) can also be used. Specific examples of the light having a wavelength of 300 nm or shorter include a KrF ray (wavelength: 248 nm) and an ArF ray (wavelength: 193 nm). Among these, a KrF ray (wavelength: 248 nm) is preferable. The irradiation dose (exposure dose) is preferably 0.03 to 2.5 J/cm$^2$, and more preferably 0.05 to 1.0 J/cm$^2$. The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

<<Development Step>>

Next, a pattern is formed by removing a non-exposed portion of the composition layer by development. The non-exposed portion of the composition layer can be removed by development using a developer. As a result, a non-exposed portion of the composition layer in the exposure step is eluted into the developer, and only the photo-cured portion remains. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

As the developer, an alkaline aqueous solution in which the above alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. A concentration of the alkaline agent in the alkaline aqueous solution is preferably 0.001 to 10 mass % and more preferably 0.01 to 1 mass %. In addition, the developer may further include a surfactant. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where the alkaline aqueous solution is used as the developer, it is preferable that the layer is rinsed with pure water after development. In addition, it is preferable that, during rinsing, a rinsing liquid is supplied to the developed composition layer while rotating the support on which the developed composition layer is formed. In addition, it is also preferable that, during rinsing, a nozzle through which the rinsing liquid is ejected is moved from a center portion of the support to a peripheral portion of the support. In this case, during the movement of the nozzle from the center portion to the peripheral portion of the support, the moving speed of the nozzle may be gradually decreased. By performing rinsing as described above, an in-plane variation of rinsing can be suppressed. In addition, even in a case where the rotation speed of the support is gradually decreased while moving the nozzle from the center portion to the peripheral portion of the support, the same effects can be obtained.

After the development, the film can also be dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 180° C. to 230° C. In addition, the heat treatment can also be performed using a method described in JP2016-172828A.

(Case Where Pattern is Formed Using Dry Etching Method)

The formation of a pattern using a dry etching method can be performed using a method including: curing the composition layer on the support to form a cured composition layer; forming a patterned photoresist layer on the cured composition layer; and dry-etching the cured composition layer with etching gas by using the patterned photoresist layer as a mask. It is preferable that pre-baking is further performed in order to form the photoresist layer. In particular, in a preferable aspect, as a process of forming the photoresist layer, baking after exposure or baking after development (post-baking) is performed. The details of the pattern formation using the dry etching method can be found in paragraphs "0010" to "0067" of JP2013-064993A, the content of which is incorporated herein by reference.

<Near Infrared Cut Filter>

The near infrared cut filter according to the embodiment of the present invention includes the film according to the embodiment of the present invention. It is preferable that the near infrared cut filter according to the embodiment of the present invention has a maximum absorption wavelength in a wavelength range of 700 to 1200 nm. In addition, an average transmittance in a wavelength range of 400 to 550 nm is preferably 70% or higher, more preferably 80% or higher, still more preferably 85% or higher, and still more preferably 90% or higher. In addition, a transmittance of in the entire wavelength range of 400 to 550 nm is preferably 70% or higher, more preferably 80% or higher, and still more preferably 90% or higher. In addition, a transmittance at at least one point in a wavelength range of 700 to 1000 nm is preferably 20% or lower, more preferably 15% or lower, and still more preferably 10% or lower.

The near infrared cut filter according to the embodiment of the present invention may further include, for example, a dielectric multi-layer film or an ultraviolet absorbing layer in addition to the film according to the embodiment of the present invention. By further including the dielectric multi-layer film in addition to the film according to the embodiment of the present invention, the near infrared cut filter according to the embodiment of the present invention having a wide viewing angle and excellent near infrared blocking properties can be easily obtained. In addition, by further including the ultraviolet absorbing layer in addition to the film according to the embodiment of the present invention, the near infrared cut filter according to the embodiment of the present invention having excellent ultraviolet blocking properties can be obtained. The details of the ultraviolet absorbing layer can be found in, for example, the description of an absorbing layer described in paragraphs "0040" to "0070" and paragraphs "0119" to "0145" of WO2015/099060, the content of which is incorporated herein by reference. The details of the dielectric multi-layer film can be found in paragraphs "0255" to "0259" of JP2014-041318A, the content of which is incorporated herein by reference.

<Solid-State Imaging Element>

A solid-state imaging element according to the embodiment of the present invention includes the film according to the embodiment of the present invention. The configuration of the solid-state imaging element is not particularly limited as long as it includes the film according to the embodiment of the present invention and functions as a solid-state imaging element. For example, the following configuration can be adopted.

The solid-state imaging element includes a plurality of photodiodes and transfers electrodes on the support, the photodiodes constituting a light receiving area of the solid-state imaging element, and the transfer electrode consisting of polysilicon or the like. In the solid-state imaging element, a light blocking film consisting of tungsten or the like which has openings through only light receiving sections of the photodiodes is provided on the photodiodes and the transfer electrodes, a device protective film consisting of silicon nitride or the like is formed on the light blocking film so as to cover the entire surface of the light blocking film and the light receiving sections of the photodiodes, and the film according to the embodiment of the present invention is formed on the device protective film. Further, a configuration in which a light collecting unit (for example, a micro-lens; hereinafter, the same shall be applied) is provided above the device protective film and below the film according to the embodiment of the present invention (on a side thereof close the support), or a configuration in which light collecting unit is provided on the film according to the embodiment of the present invention may be adopted. In addition, the color filter may have a structure in which a film which forms each pixel is embedded in a space which is partitioned in, for example, a lattice shape by a partition wall. In this case, it is preferable that the partition wall has a lower refractive index than each pixel. Examples of an imaging device having such a structure include a device described in JP2012-227478A and JP2014-179577A.

<Image Display Device>

An image display device according to the embodiment of the present invention comprises the film according to the embodiment of the present invention. Examples of the image display device include a liquid crystal display device or an organic electroluminescence (organic EL) display device. The definition and details of the image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques". The image display device may include a white organic EL element. It is preferable that the white organic EL element has a tandem structure. The tandem structure of the organic EL element is described in, for example, JP2003-045676A, or pp. 326-328 of "Forefront of Organic EL Technology Development-Know-How Collection of High Brightness, High Precision, and Long Life" (Technical Information Institute, 2008). It is preferable that a spectrum of white light emitted from the organic EL element has high maximum emission peaks in a blue range (430 to 485 nm), a green range (530 to 580 nm), and a yellow range (580 to 620 nm). It is more preferable that the spectrum has a maximum emission peak in a red range (650 nm to 700 nm) in addition to the above-described emission peaks.

<Infrared Sensor>

An infrared sensor according to the embodiment of the present invention includes the film according to the embodiment of the present invention. The configuration of the infrared sensor is not particularly limited as long as it functions as an infrared sensor. Hereinafter, an embodiment of the infrared sensor used in the present invention will be described using the drawings.

In FIG. 1, reference numeral 110 represents a solid-state imaging element. In an imaging region provided on a solid-state imaging element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

The near infrared cut filter 111 can be formed using the curable composition according to the embodiment of the present invention. Spectral characteristics of the near infrared cut filters 111 can be selected according to the emission wavelength of an infrared light emitting diode (infrared LED) to be used. The color filters 112 is not particularly limited as long as pixels which allow transmission of light having a specific wavelength in the visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference. Characteristics of the infrared transmitting filters 114 can be selected according to the emission wavelength of the infrared LED to be used. The infrared transmitting filter 114 can also be formed using the curable composition according to the embodiment of the present invention.

In the infrared sensor shown in FIG. 1, a near infrared cut filter (other near infrared cut filter) other than the near infrared cut filter 111 may be further disposed on the planarizing layer 116. As the other near infrared cut filter, for example, a layer containing copper and/or a dielectric multilayer film may be provided. In addition, as the other near infrared cut filter, a dual band pass filter may be used. In addition, in the infrared sensor illustrated in FIG. 1, the position of the near infrared cut filter 111 and the position of the color filter 112 may be replaced with each other. In addition, another layer may be arranged between the solid-state imaging element 110 and the near infrared cut filter 111 and/or between the solid-state imaging element 110 and the infrared transmitting filter 114. Examples of the other layer include an organic layer that is formed using a composition including curable compound. In addition, a planarizing layer may be formed on the color filter 112.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

<Measurement of Weight-Average Molecular Weight (Mw)>

The weight-average molecular weight (Mw) of a sample was measured under the following conditions.

Kind of Column: TSKgel Super HZ4000 (manufactured by Tosoh Corporation, 4.6 mm (Inner diameter)×15 cm)
Developing solvent: tetrahydrofuran
Column temperature: 40° C.
Flow rate (sample injection volume): 60 µL
Device name: High-Speed GPC (HLC-8220GPC), manufactured by Tosoh Corporation
Calibration curve base resin: polystyrene <Preparation of Curable Composition>

(Examples 1 to 16 and Comparative Examples 1 and 3)

Raw materials having the following compositions 1 to 7 were mixed with each other to prepare curable compositions, respectively.

<Composition 1>
Compound shown in the following table: 2.3 parts
Resin 1: 12.8 parts
Ultraviolet absorber 1: 0.5 parts
Surfactant 1: 0.04 parts
Cyclohexanone: 84.36 parts <Composition 2>
Compound shown in the following table: 2.3 parts
Resin 2: 12.8 parts
Ultraviolet absorber 1: 0.5 parts
Surfactant 1: 0.04 parts
Cyclohexanone: 64.36 parts
N-methylpyrrolidone: 20 parts <Composition 3>
Compound shown in the following table: 2.3 parts
Resin 3: 12.9 parts
Crosslinking compound 1: 12.9 parts
Photopolymerization initiator 1: 2.5 parts
Ultraviolet absorber 1: 0.5 parts
Surfactant 1: 0.04 parts
Polymerization inhibitor (p-methoxyphenol): 0.006 parts
Cyclohexanone: 49.6 parts
Propylene glycol monomethyl ether acetate: 19.3 parts <Composition 4>
Compound shown in the following table: 2.3 parts
Resin 4: 12.9 parts
Crosslinking compound 1: 12.9 parts
Photopolymerization initiator 1: 2.5 parts
Ultraviolet absorber 1: 0.5 parts
Surfactant 1: 0.04 parts
Polymerization inhibitor (p-methoxyphenol): 0.006 parts
Cyclohexanone: 49.6 parts
Propylene glycol monomethyl ether acetate: 19.3 parts <Composition 5>
Compound shown in the following table: 2.3 parts
Resin 5: 12.9 parts
Crosslinking compound 2: 12.9 parts
Acid generator 1: 2.5 parts
Ultraviolet absorber 1: 0.5 parts
Surfactant 1: 0.04 parts
Cyclohexanone: 49.6 parts
Propylene glycol monomethyl ether acetate: 19.3 parts <Composition 6>
Compound shown in the following table: 2.3 parts
Resin 6: 12.9 parts
Acid catalyst (phosphoric acid): 2.5 parts Ultraviolet absorber 1: 0.5 parts
Surfactant 1: 0.04 parts
Cyclohexanone: 58.9 parts
Propylene glycol monomethyl ether acetate: 22.9 parts
<Composition 7>
Each of compounds shown in the following table: 1.2 parts
Resin 1: 12.8 parts
Ultraviolet absorber 1: 0.5 parts
Surfactant 1: 0.04 parts
Cyclohexanone: 84.26 parts (Resin)
Resin 1: ARTON F4520 (manufactured by JSR Corporation)
Resin 2: NEOPULIM (registered trade name) C3450 (manufactured by Mitsubishi Gas Chemical Company Inc.)
Resin 3: a copolymer including benzyl methacrylate (BzMA) and methacrylic acid (MAA) (compositional ratio (mass ratio): (BzMA/MAA)=(80/20), Mw=15,000)
Resin 4: a copolymer including allyl methacrylate (AMA) and methacrylic acid (MAA) (compositional ratio (mass ratio): (AMA/MAA)=(80/20), Mw=15,000)
Resin 5: a copolymer including glycidyl methacrylate (GlyMA) and methacrylic acid (MAA) (compositional ratio (mass ratio): (GlyMA/MAA)=(80/20), Mw=15,000)
Resin 6: a compound having the following structure (numerical values added to the repeating unit represent a molar ratio, Me represents a methyl group, Mw=18,000)

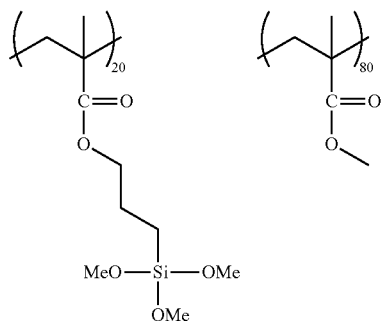

(Crosslinking Compound)
Crosslinking compound 1: dipentaerythritol hexaacrylate (trade name: KAYARAD DPHA, manufactured by Nippon Kayaku Co., Ltd.)
Crosslinking compound 2: OXT-221 (manufactured by Toagosei Co., Ltd.)
(Photopolymerization Initiator)
Photopolymerization initiator 1: IRGACURE-OXE01 (manufactured by BASF SE, [2-(O-benzoyloxime)-1-[4-(phenylthio)phenyl]-1,2-octanedione]
(Acid Generator)
Acid generator 1: CPI-100P (manufactured by San-Apro Ltd.)
(Ultraviolet Absorber)
Ultraviolet absorber 1: UV-503 (manufactured by Daito Chemical Co., Ltd.)
(Surfactant)
Surfactant 1: the following compound (Mw=14000, "%" representing the proportion of a repeating unit is mol %)

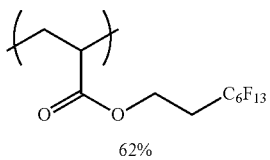
62%

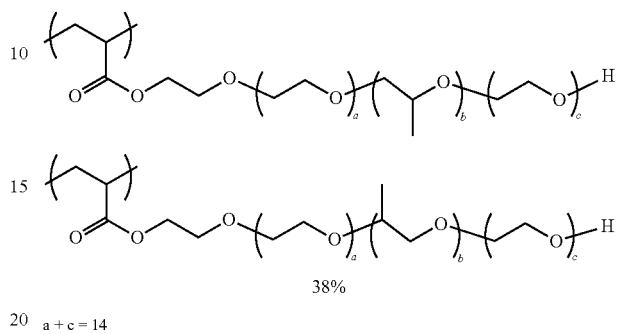
38%

$a + c = 14$
$b = 17$

TABLE 1

| | Compound | | |
|---|---|---|---|
| | Formula | Kind | -Es' Value |
| Example 1 | Composition 1 | SQ-1 | 5.29 |
| Example 2 | Composition 2 | SQ-1 | 5.29 |
| Example 3 | Composition 3 | SQ-1 | 5.29 |
| Example 4 | Composition 4 | SQ-1 | 5.29 |
| Example 5 | Composition 4 | SQ-2 | 3.54 |
| Example 6 | Composition 4 | SQ-3 | 2.48 |
| Example 7 | Composition 4 | SQ-4 | 5.01 |
| Example 8 | Composition 4 | SQ-5 | 2.97 |
| Example 9 | Composition 1 | SQ-6 | 5.29 |
| Example 10 | Composition 1 | SQ-9 | 5.29 |
| Example 11 | Composition 1 | SQ-10 | 5.29 |
| Example 12 | Composition 1 | SQ-12 | 3.23 |
| Example 13 | Composition 1 | CY-1 | 5.29 |
| Example 14 | Composition 5 | SQ-1 | 5.29 |
| Example 15 | Composition 6 | SQ-1 | 5.29 |
| Example 16 | Composition 7 | SQ-1 + SQ-6 | 5.29 |
| Example 17 | Composition 7 | SQ-1 + Compound A | 5.29 |
| Example 18 | Composition 7 | SQ-1 + Compound B | 5.29 |
| Example 19 | Composition 7 | SQ-10 + Compound C | 5.29 |
| Example 20 | Composition 7 | SQ-10 + Compound D | 5.29 |
| Example 21 | Composition 7 | SQ-1 + Compound E | 5.29 |
| Comparative Example 1 | Composition 4 | SQ-A | 2.26 |
| Comparative Example 2 | Composition 4 | SQ-B | 0 |
| Comparative Example 3 | Composition 4 | CY-A | 0 |

Compounds shown in the above-described table are compounds having the following structures. In the following structural formulae, Me represents a methyl group. The -Es' value shown in the above-described table is an -Es' value of a group in a portion corresponding to $G^2$ of the group represented by Formula (1).

SQ-1
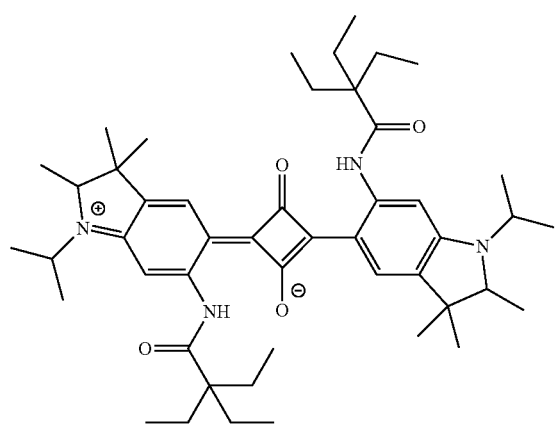
SQ-4
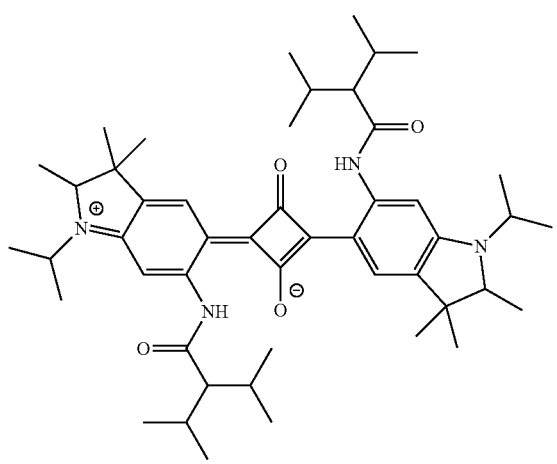
SQ-2
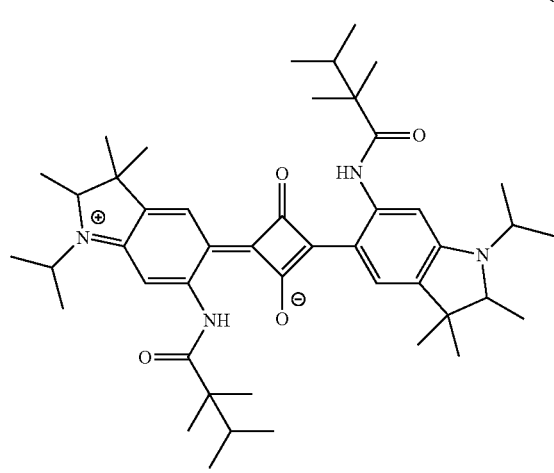
SQ-5
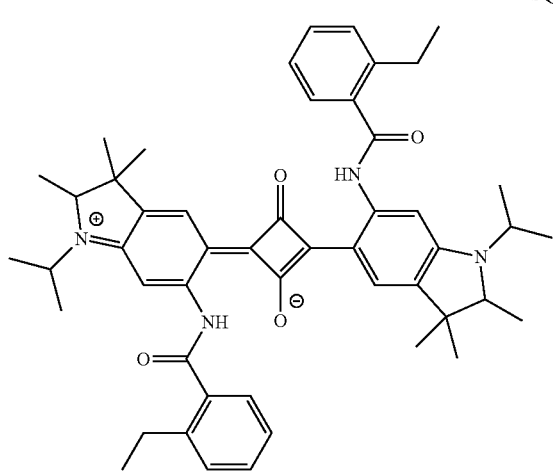
SQ-3
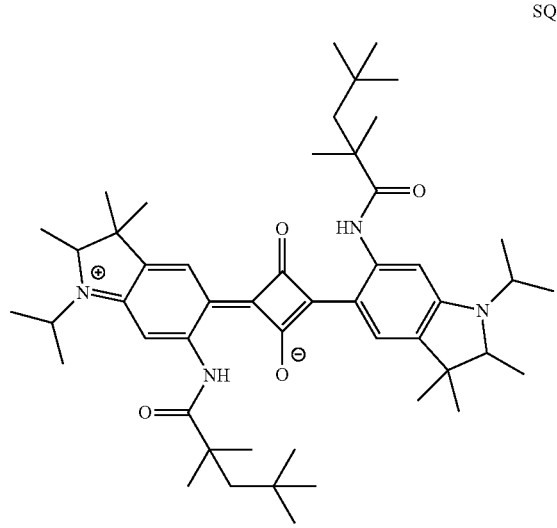
SQ-6
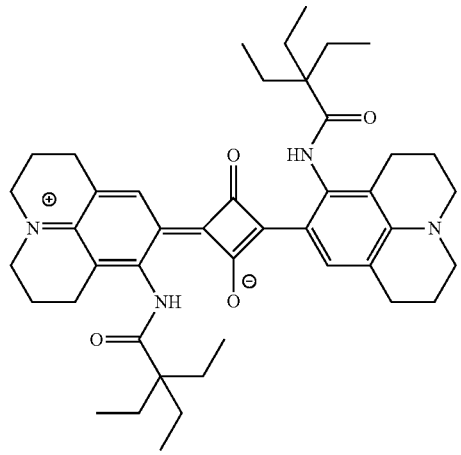

-continued
SQ-9
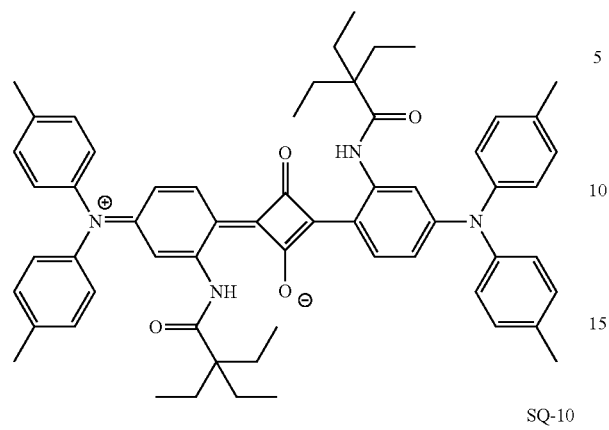
SQ-A
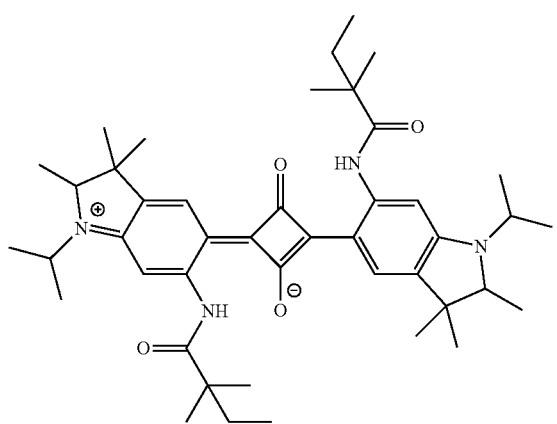
SQ-10
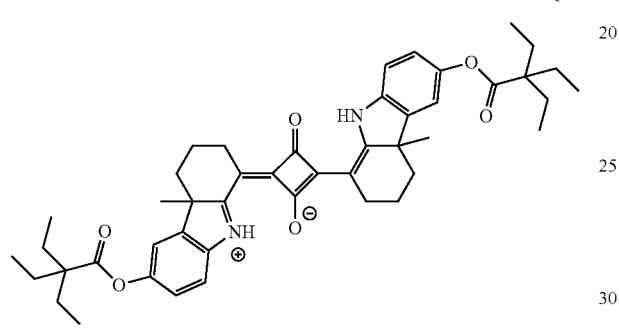
SQ-B
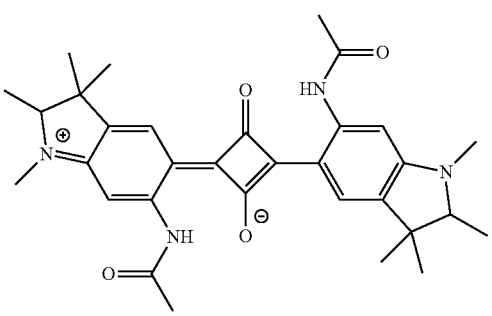
SQ-12
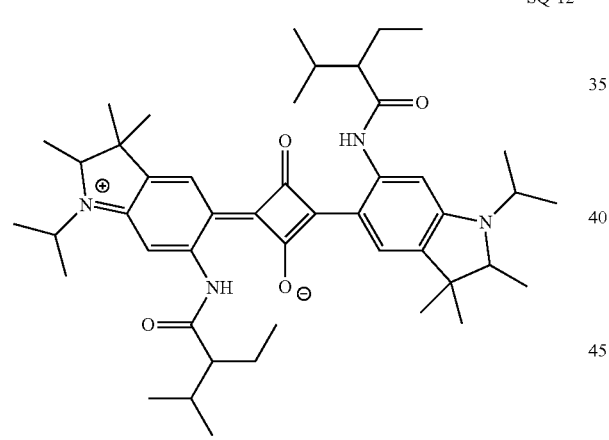
CY-1
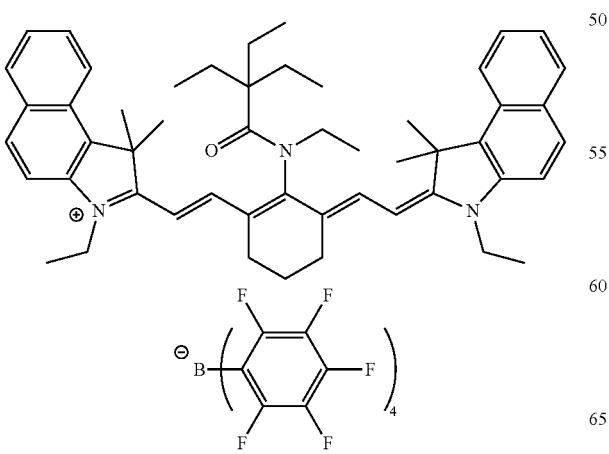
CY-A
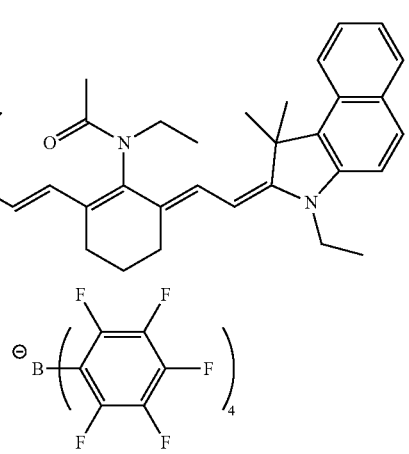

-continued

Compound A

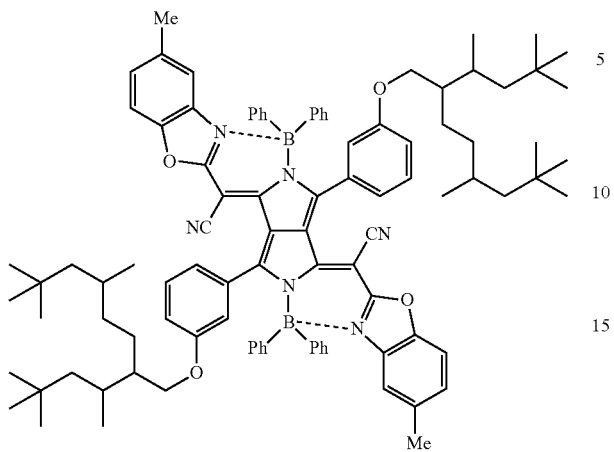

Compound B

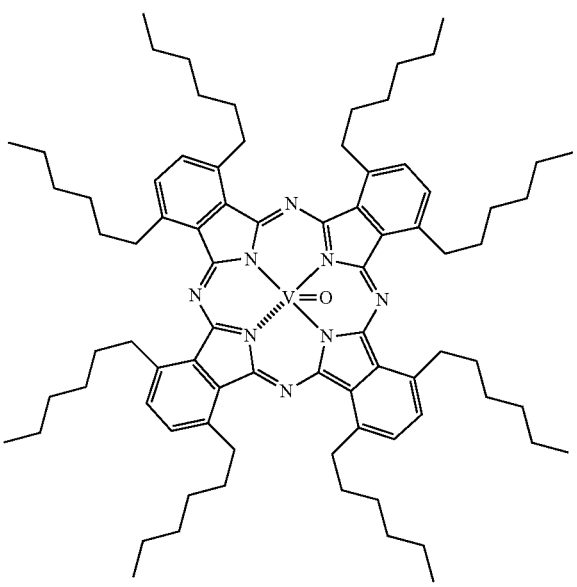

Compound C

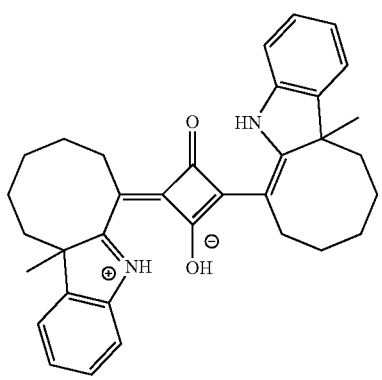

-continued

Compound D

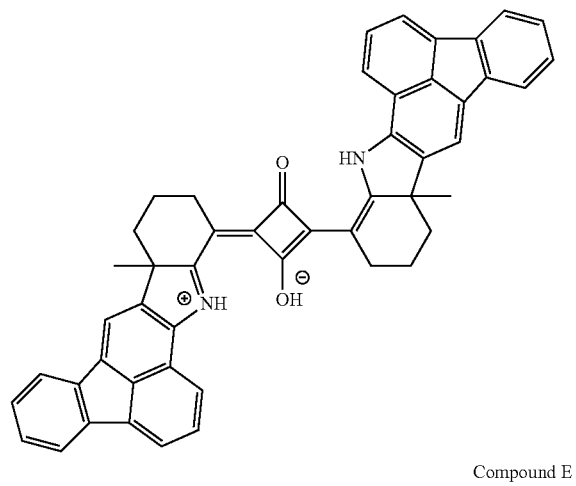

Compound E

<Preparation of Film>
(Preparation Example 1)
(Method of Preparing Film Using Each of Curable Compositions Having Compositions 1, 2, and 7)

Each of the curable compositions was applied to a glass substrate (1737, manufactured by Corning Inc.) using a spin coater such that the thickness of a dried film was 1.0 μm, and was heated (pre-baked) using a hot plate at 100° C. for 120 seconds. Next, the coating film was further heated (post-baked) using a hot plate at 200° C. for 300 seconds to form a film.

(Preparation Example 2)
(Method of Preparing Film Using Each of Curable Compositions Having Compositions 3, 4, and 5)

Each of the curable compositions was applied to a glass substrate (1737, manufactured by Corning Inc.) using a spin coater such that the thickness of a dried film was 1.0 μm, and was heated (pre-baked) using a hot plate at 100° C. for 120 seconds. Next, the entire surface of the coating film was exposed using an i-ray stepper exposure device FPA-3000 i5+ (manufactured by Canon Corporation) at 500 mJ/cm². Next, the glass substrate underwent puddle development at 23° C. for 60 seconds using a developer (CD-2060, manufactured by Fujifilm Electronic Materials Co., Ltd.), was rinsed with pure water, and was spin-dried. Further, the coating film was further heated (post-baked) using a hot plate at 200° C. for 300 seconds to form a film.

(Preparation Example 3)
(Method of Preparing Film Using Curable Composition Having Composition 6)

The curable composition was applied to a glass substrate (1737, manufactured by Corning Inc.) using a spin coater such that the thickness of a dried film was 1.0 μm, and was heated (pre-baked) using a hot plate at 100° C. for 120 seconds. Next, the coating film was further heated (post-baked) using a hot plate at 180° C. for 300 seconds to form a film.

(Evaluation of Visible Transparency)

The absorption spectrum of the obtained film in a wavelength range of 300 to 900 nm was measured using a spectrophotometer (U-4100, manufactured by Hitachi High-Technologies Corporation). The maximum absorption wavelength of the obtained film was present in a near infrared range (650 to 1200 nm). In a case where the absorbance of the maximum absorption wavelength was represented by 1, an average absorbance in a wavelength range of 400 to 550 nm was calculated, and the visible transparency was evaluated based on the following standards. The maximum absorption wavelength of the obtained film was present in a near infrared range (650 to 1200 nm). Therefore, in a case where the absorbance of the maximum absorption wavelength is represented by 1, it can be said that, as the average absorbance in a wavelength range of 400 to 550 nm decreases, the visible transparency becomes higher.

A: lower than 0.05
B: 0.05 or higher and lower than 0.075
C: 0.075 or higher and lower than 0.1

(Evaluation of Moisture Resistance)

The obtained film was left to stand in a high temperature and high humidity environment at 85° C. and a relative humidity of 85% for 10 hours, and a moisture-resistance test was performed. Regarding each of the films before and after the moisture resistance test, using a spectrophotometer (U-4100, manufactured by Hitachi High-Technologies Corporation), a maximum absorbance (Absλmax) in a wavelength range of 650 to 1200 nm and a minimum absorbance (Absλmin) in a wavelength range of 400 to 650 nm were measured, and an absorbance ratio represented by "Absλmax/Absλmin" was obtained.

A change rate of absorbance ratio represented by "{(Absorbance Ratio of Film before Moisture-Resistance Test−Absorbance Ratio of Film after Moisture-Resistance Test)/Absorbance Ratio of Film before Moisture-Resistance Test}×100 (%)" was evaluated based on the following standards. The results are shown in the following table.

A: Change Rate of Absorbance Ratio≤2%
B: 2%<Change Rate of Absorbance Ratio≤4%
C: 4%<Change Rate of Absorbance Ratio≤7%
D: 7%<Change Rate of Absorbance Ratio≤10%
E: 10%<Change Rate of Absorbance Ratio (Light Fastness)

The obtained film was irradiated with light at 10000 lux using a Xe lamp through an ultraviolet cut filter for 225 hours, and a light fastness test was performed. A ΔEab value of a color difference of the film before and after a light fastness test was measured using a colorimeter MCPD-1000 (manufactured by Otsuka Electronics Co., Ltd.).

A: ΔEab Value<2.5
B: 2.5≤ΔEab Value<5
C: 5≤ΔEab value<10
D: 10≤ΔEab value<15
E: 15≤ΔEab value

TABLE 2

| | Visible Transparency | Light Fastness | Moisture Resistance |
|---|---|---|---|
| Example 1 | A | A | A |
| Example 2 | A | A | A |
| Example 3 | A | A | A |
| Example 4 | A | A | A |
| Example 5 | A | B | A |
| Example 6 | B | B | B |
| Example 7 | A | B | A |
| Example 8 | B | C | B |
| Example 9 | A | A | A |
| Example 10 | A | A | A |
| Example 11 | B | B | B |
| Example 12 | B | C | B |
| Example 13 | A | C | C |
| Example 14 | A | A | A |
| Example 15 | A | A | A |
| Example 16 | A | A | A |
| Example 17 | A | A | A |
| Example 18 | B | A | A |
| Example 19 | B | C | B |
| Example 20 | C | B | B |
| Example 21 | A | B | A |
| Comparative Example 1 | C | D | D |
| Comparative Example 2 | C | D | D |
| Comparative Example 3 | C | E | E |

As shown in the above-described table, by using the curable composition according to Examples, a film having excellent light fastness and moisture resistance was able to be obtained. In addition, this film had a maximum absorption wavelength in a near infrared range, in which near infrared blocking properties and visible transparency were excellent.

EXPLANATION OF REFERENCES

110: solid-state imaging element
111: near infrared cut filter
112: color filter
114: infrared transmitting filter
115: microlens
116: planarizing layer

What is claimed is:

1. A curable composition comprising:
   a near infrared absorbing colorant having a group represented by the following Formula (1); and
   a curable compound,

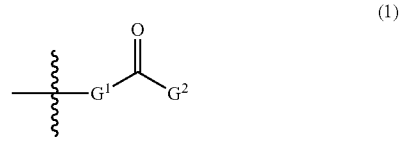

in the formula, $G^1$ represents an oxygen atom, and
   $G^2$ represents a monovalent substituent having a -Es' value of 2.4 or higher as a steric parameter.

2. The curable composition according to claim 1, wherein $G^2$ represents a tertiary alkyl group.

3. The curable composition according to claim 1, wherein the near infrared absorbing colorant has a maximum absorption wavelength in a range of 650 to 1200 nm.

4. The curable composition according to claim 1, wherein the near infrared absorbing colorant is a polymethine compound.

5. The curable composition according to claim 1, wherein the near infrared absorbing colorant is at least one selected from a cyanine compound, a squarylium compound, or a croconium compound.

6. The curable composition according to claim 1, wherein the near infrared absorbing colorant is a compound represented by the following formula (SQ1),

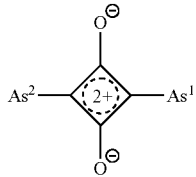

(SQ1)

in the formula, $As^1$ and $As^2$ each independently represent an aryl group, a heterocyclic group, or a group represented by Formula (As-1), and at least one of $As^1$ or $As^2$ has the group represented by Formula (1) as a substituent,

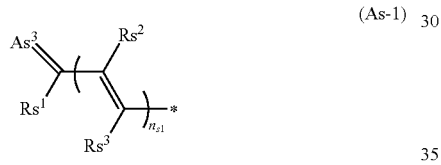

(As-1)

in the formula, * represents a bonding site, $Rs^1$ to $Rs^3$ each independently represent a hydrogen atom or an alkyl group, $As^3$ represents a heterocyclic group, $n_{s1}$ represents an integer of 0 or more, $Rs^1$ and $Rs^2$ may be bonded to each other to form a ring, $Rs^1$ and $As^3$ may be bonded to each other to form a ring, $Rs^2$ and $Rs^3$ may be bonded to each other to form a ring, and in a case where $n_{s1}$ represents 2 or more, a plurality of $Rs^2$'s may be the same as or different from each other and a plurality of $Rs^3$'s may be the same as or different from each other.

7. A curable composition comprising a near infrared absorbing colorant represented by the following Formula Cy1; and a curable compound:

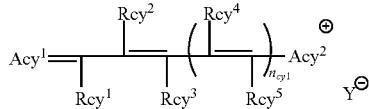

(Cy1)

wherein, in the formula, Y represents an anion, $Rcy^1$ to $Rcy^5$ each independently represent a hydrogen atom or a substituent, at least one of $Rcy^1$, $Rcy^2$, $Rcy^3$, $Rcy^4$ or $Rcy^5$ represents the group represented by the following Formula (1);

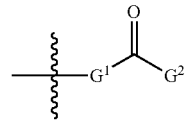

(1)

wherein in Formula (1), $G^1$ represents $NR^{G1}$ or an oxygen atom, $R^{G1}$ represents a hydrogen atom or a monovalent substituent, and $G^2$ represents a monovalent substituent having a -Es' value of 2.4 or higher as a steric parameter, two of $Rcy^1$ to $Rcy^5$ may be bonded to each other to form a ring, $n_{cy1}$ represents an integer of 0 to 2, in a case where $n_{cy1}$ represents 2, a plurality of $Rcy^4$'s may be the same as or different from each other and a plurality of $Rcy^5$'s may be the same as or different from each other, and $Acy^1$ and $Acy^2$ each independently represent an aryl group or a heterocyclic group.

8. The curable composition according to claim 1, wherein the near infrared absorbing colorant is a compound represented by the following Formula (Cr1),

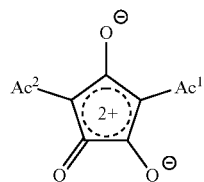

(Cr1)

in the formula, $Ac^1$ and $Ac^2$ each independently represent an aryl group, a heterocyclic group, or a group represented by Formula (Ac-1), and at least one of $Ac^1$ or $Ac^2$ has the group represented by Formula (1) as a substituent,

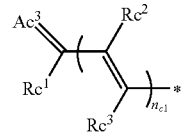

(Ac-1)

in the formula, * represents a bonding site, $Rc^1$ to $Rc^3$ each independently represent a hydrogen atom or an alkyl group, $Ac^3$ represents a heterocyclic group, $n_{c1}$ represents an integer of 0 or more, $Rc^1$ and $Rc^2$ may be bonded to each other to form a ring, $Rc^1$ and $Ac^3$ may be bonded to each other to form a ring, $Rc^2$ and $Rc^3$ may be bonded to each other to form a ring, and in a case where $n_{c1}$ represents 2 or more, a plurality of $Rc^2$'s may be the same as or different from each other and a plurality of $Rc^3$'s may be the same as or different from each other.

9. A near infrared absorber comprising a near infrared absorbing colorant having a group represented by the following Formula (1),

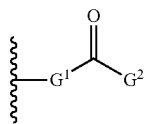

(10)

in the formula, $G^1$ represents an oxygen atom, and $G^2$ represents a monovalent substituent having a -Es' value of 2.4 or higher as a steric parameter.

10. A film which is formed of the curable composition according to claim 1.

11. A near infrared cut filter comprising:
the film according to claim 10.

12. A solid-state imaging element comprising:
the film according to claim 10.

13. An image display device comprising:
the film according to claim 10.

14. An infrared sensor comprising:
the film according to claim 10.

\* \* \* \* \*